(12) United States Patent
Kitamura et al.

(10) Patent No.: US 12,191,419 B2
(45) Date of Patent: Jan. 7, 2025

(54) SEMICONDUCTOR ELEMENT AND SEMICONDUCTOR DEVICE

(71) Applicant: SONY SEMICONDUCTOR SOLUTIONS CORPORATION, Kanagawa (JP)

(72) Inventors: Shota Kitamura, Kanagawa (JP); Tetsuji Yamaguchi, Kanagawa (JP); Akihiro Wakahara, Aichi (JP); Keisuke Yamane, Aichi (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 372 days.

(21) Appl. No.: 17/753,585

(22) PCT Filed: Jun. 4, 2020

(86) PCT No.: PCT/JP2020/022130
§ 371 (c)(1),
(2) Date: Mar. 8, 2022

(87) PCT Pub. No.: WO2021/053893
PCT Pub. Date: Mar. 25, 2021

(65) Prior Publication Data
US 2022/0336703 A1     Oct. 20, 2022

(30) Foreign Application Priority Data

Sep. 17, 2019 (JP) ................. 2019-167987

(51) Int. Cl.
*H01L 33/30* (2010.01)
*H01L 33/40* (2010.01)

(52) U.S. Cl.
CPC .............. *H01L 33/30* (2013.01); *H01L 33/40* (2013.01)

(58) Field of Classification Search
CPC ... H01L 33/30; H01L 33/40; H01L 27/14612; H01L 27/1464; H01L 27/14643;
(Continued)

(56) References Cited

U.S. PATENT DOCUMENTS

2005/0082563 A1   4/2005  Tsai et al.
2005/0168899 A1   8/2005  Sato et al.
(Continued)

FOREIGN PATENT DOCUMENTS

CN       1652346 A    8/2005
CN     102130141 A    7/2011
(Continued)

OTHER PUBLICATIONS

J.F. Geisz et al. "Lattice-Matched GaNPAs-on-Silicon Tandem Solar Cells", 31st IEEE Photovoltaics Specialists Conference and Exhibition, Jan. 3-7, 2005, Conference Paper. (Year: 2005).*
(Continued)

*Primary Examiner* — J. E. Schoenholtz
(74) *Attorney, Agent, or Firm* — CHIP LAW GROUP

(57) ABSTRACT

Inhibition of movement of charges in a semiconductor element formed by growing a group III-V compound semiconductor layer on a silicon substrate is prevented. The semiconductor element includes a silicon substrate, a first compound semiconductor layer, a second compound semiconductor layer, and an electrode. The first compound semiconductor layer is formed on the silicon substrate. The second compound semiconductor layer is stacked on the first compound semiconductor layer. The electrode is disposed on the silicon substrate and controls movement of charges between the silicon substrate and the second compound semiconductor layer via the first compound semiconductor layer.

19 Claims, 14 Drawing Sheets

(58) Field of Classification Search
CPC ......... H01L 27/14665; H01L 27/14694; H01L 27/14621; H01L 27/14627; H01L 27/1463; H01L 31/022408; H01L 31/02327; H01L 31/0304; H01L 31/109; H01L 33/42; H01L 33/38; H01L 33/32; H04N 25/76; H04N 25/771
See application file for complete search history.

(56) References Cited

U.S. PATENT DOCUMENTS

| | | | |
|---|---|---|---|
| 2010/0182471 A1 | 7/2010 | Toda | |
| 2013/0264670 A1 | 10/2013 | Kamimura et al. | |
| 2015/0091121 A1 | 4/2015 | Manda et al. | |
| 2015/0171242 A1* | 6/2015 | Nagahiro | H01L 31/09 257/184 |
| 2018/0076252 A1* | 3/2018 | Togashi | H10K 30/82 |

FOREIGN PATENT DOCUMENTS

| | | |
|---|---|---|
| CN | 103367372 A | 10/2013 |
| CN | 104517981 A | 4/2015 |
| JP | 2002-289909 A | 10/2002 |
| JP | 2006-066863 A | 3/2006 |
| JP | 2006-216968 A | 8/2006 |
| JP | 2011-146635 A | 7/2011 |
| JP | 2013-219189 A | 10/2013 |
| JP | 2015-070070 A | 4/2015 |
| KR | 10-2011-0070788 A | 6/2011 |
| KR | 10-2013-0114609 A | 10/2013 |
| KR | 10-2015-0035397 A | 4/2015 |
| TW | 201143052 A | 12/2011 |
| TW | 201513324 A | 4/2015 |

OTHER PUBLICATIONS

Vladimir V. Fedorov, et al., "Dual-functional light-emitting and photo-detecting GaAsPN heterostructures on silicon", Materials Science in Semiconductor Processing, vol. 168, Dec. 2023, p. 107867, https://doi.org/10.1016/j.mssp.2023.107867. (Year: 2023).*
Alexandra A. Lazarenko, et al., "GaPAsN-based light-emitting diode on silicon", Optics & Laser Technology, vol. 129, 2020, p. 106308, https://doi.org/10.1016/j.optlastec.2020.106308. (Year: 2020).*
Takahashi, "Electrical properties of GaAsPN p-i-n junctions on Si substrates toward lattice matched III-V/Si solar cells", 64th JSAP Spring Meeting Proceedings, 2017, pp. 13-277.
International Search Report and Written Opinion of PCT Application No. PCT/JP2020/022130, issued on Aug. 11, 2020, 13 pages of ISRWO.

* cited by examiner

SEMICONDUCTOR ELEMENT AND SEMICONDUCTOR DEVICE

CROSS REFERENCE TO RELATED APPLICATIONS

This application is a U.S. National Phase of International Patent Application No. PCT/JP2020/022130 filed on Jun. 4, 2020, which claims priority benefit of Japanese Patent Application No. JP 2019-167987 filed in the Japan Patent Office on Sep. 17, 2019. Each of the above-referenced applications is hereby incorporated herein by reference in its entirety.

TECHNICAL FIELD

The present disclosure relates to a semiconductor element and a semiconductor device. Specifically, the present disclosure relates to a semiconductor element including a compound semiconductor and a semiconductor device using the semiconductor element.

BACKGROUND ART

Conventionally, a semiconductor element including a compound semiconductor layer formed on a single crystal silicon substrate has been used. For example, a semiconductor element obtained by epitaxially growing gallium arsenide (GaAs) or the like, which is a group III-V compound semiconductor, on a silicon substrate is used. However, since the group III-V compound semiconductor has a lattice constant largely different from silicon (Si), many crystal defects are generated in the group III-V compound semiconductor. Therefore, a semiconductor element has been proposed in which gallium phosphide (GaP) is disposed as a buffer layer between the silicon substrate and the group III-V compound semiconductor (see, for example, Patent Document 1.).

CITATION LIST

Patent Document

Patent Document 1: Japanese Patent Application Laid-Open No. 2006-216968

SUMMARY OF THE INVENTION

Problems to be Solved by the Invention

In the above-described prior art, the group III-V compound semiconductor is applied to a light emitting element. In a case where the group III-V compound semiconductor using GaP as a buffer layer is applied to a light receiving element, a difference in bandgap between layers is a problem. Specifically, since GaP has a larger band gap than Si or the group III-V compound semiconductor, the difference in band gap acts as a barrier when carriers pass through a region of the GaP layer, and movement of charges is inhibited disadvantageously.

The present disclosure has been made in view of the above-described problems, and an object of the present disclosure is to prevent inhibition of movement of charges in a semiconductor element formed by growing a group III-V compound semiconductor layer on a silicon substrate.

Solutions to Problems

The present disclosure has been made in order to solve the above-described problems, and a first aspect thereof is a semiconductor element including a silicon substrate, a first compound semiconductor layer formed on the silicon substrate, a second compound semiconductor layer stacked on the first compound semiconductor layer, and an electrode that is disposed on the silicon substrate and controls movement of charges between the silicon substrate and the second compound semiconductor layer via the first compound semiconductor layer.

Furthermore, in the first aspect, the first compound semiconductor layer may contain Ga and P.

Furthermore, in the first aspect, the second compound semiconductor layer may contain Ga, As, P, and N.

Furthermore, in the first aspect, the first compound semiconductor layer may have a film thickness of 50 nm or less.

Furthermore, in the first aspect, the second compound semiconductor layer may have a film thickness of 3 µm or more.

Furthermore, in the first aspect, the electrode may be disposed on a front surface of the silicon substrate, and the first compound semiconductor layer may be formed on a back surface of the silicon substrate that is a surface different from the front surface.

Furthermore, in the first aspect, a second electrode which is disposed adjacent to the second compound semiconductor layer and in which a voltage for controlling movement of the charges is applied between the electrode and the second electrode may be further included.

Furthermore, in the first aspect, the second electrode may be constituted by a transparent electrode.

Furthermore, in the first aspect, a fixed charge film disposed adjacent to the second compound semiconductor layer and constituted by a dielectric having fixed charges may be further included, and the second electrode may be constituted by a charge accumulation region formed in the second compound semiconductor layer on the basis of the fixed charges of the fixed charge film.

Furthermore, in the first aspect, a third compound semiconductor layer stacked on the second compound semiconductor layer and having a conductivity type different from the second compound semiconductor layer may be further included.

Furthermore, in the first aspect, a separation unit that surrounds and separates the second compound semiconductor layer may be further included.

Furthermore, in the first aspect, the separation unit may be constituted by a dielectric having fixed charges.

Furthermore, in the first aspect, the separation unit may be constituted by a compound semiconductor having a conductivity type different from the second compound semiconductor layer.

Furthermore, in the first aspect, the electrode may control movement of the charges generated in the second compound semiconductor layer by photoelectric conversion.

Furthermore, in the first aspect, the electrode may perform the control by application of a control signal for moving the charges to the silicon substrate.

Furthermore, in the first aspect, a charge holding unit that is disposed in the silicon substrate and holds the moved charges may be further included.

Furthermore, in the first aspect, an image signal generation circuit that generates an image signal on the basis of the held charges may be further included.

Furthermore, in the first aspect, a separation layer that surrounds and separates the silicon substrate may be further included.

Furthermore, in the first aspect, the electrode may control movement of charges to be recombined for light emission in the second compound semiconductor layer.

Furthermore, a second aspect of the present disclosure is a semiconductor device including a silicon substrate, a first compound semiconductor layer formed on the silicon substrate, a second compound semiconductor layer stacked on the first compound semiconductor layer, an electrode that is disposed on the silicon substrate and controls movement of charges between the silicon substrate and the second compound semiconductor layer via the first compound semiconductor layer, and a control circuit that supplies a control signal for the control to the electrode.

By adopting the above-described aspects, there is an effect that movement of charges between the silicon substrate and the second compound semiconductor layer via the first compound semiconductor layer is controlled.

MODE FOR CARRYING OUT THE INVENTION

Next, modes for carrying out the present disclosure (hereinafter, referred to as embodiments) will be described with reference to the drawings. In the following drawings, the same or similar parts are denoted by the same or similar reference signs. Furthermore, the embodiments will be described in the following order.

1. First Embodiment
2. Second Embodiment
3. Third Embodiment
4. Fourth Embodiment
5. Fifth Embodiment
6. Sixth Embodiment
7. Seventh Embodiment
8. Eighth Embodiment
9. Ninth Embodiment 1. First Embodiment

[Configuration of Semiconductor Element]

Figure 1:
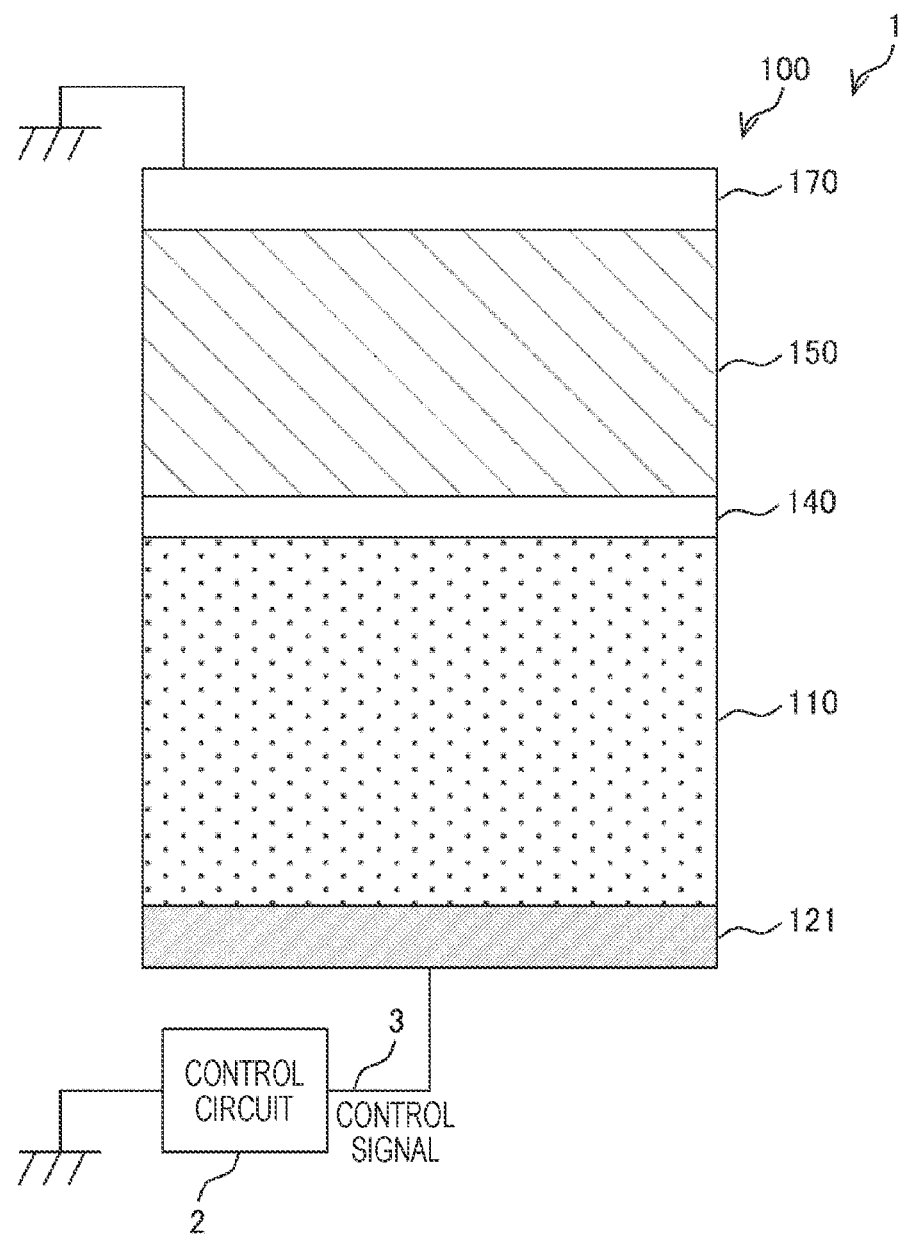
FIG. 1 is a diagram illustrating a configuration example of a semiconductor device according to a first embodiment of the present disclosure.

FIG. 1 is a diagram illustrating a configuration example of a semiconductor device according to a first embodiment of the present disclosure. FIG. 1 is a diagram illustrating a configuration example of a semiconductor device 1. The semiconductor device 1 in FIG. 1 includes a semiconductor element 100 and a control circuit 2. Note that FIG. 1 is a diagram for explaining an outline of configurations of the semiconductor device 1 and the semiconductor element 100.

The semiconductor element 100 is a semiconductor element including a compound semiconductor layer. The semiconductor element 100 in FIG. 1 is formed as a two-terminal element, and one end is grounded and the other end is connected to the control circuit 2 via a signal line 3. The control circuit 2 generates a control signal based on the ground potential and supplies the control signal to the semiconductor element 100 via the signal line 3. Note that the configuration of the semiconductor device 1 in FIG. 1 is not limited to this example. For example, it is also possible to adopt a configuration in which one end of the semiconductor element 100 is set to a potential other than the ground potential.

The semiconductor element 100 in FIG. 1 includes a silicon substrate 110, an electrode 121, a first compound semiconductor layer 140, a second compound semiconductor layer 150, and a second electrode 170. The electrode 121 and the compound semiconductor layer (the first compound semiconductor layer 140 and the second compound semiconductor layer 150) are disposed on the silicon substrate 110. The electrode 121 is disposed on a front surface of the silicon substrate 110. The compound semiconductor layer is disposed on a back surface of the silicon substrate 110 that is a surface different from the front surface.

The silicon substrate 110 is a substrate constituted by Si. For the silicon substrate 110, a single crystal Si wafer or the like can be used. Furthermore, the silicon substrate 110 can have an n-type conductivity type, for example.

The first compound semiconductor layer 140 is a compound semiconductor layer formed on the silicon substrate 110. For the first compound semiconductor layer 140, for example, a compound semiconductor containing gallium (Ga) and phosphorus (P) can be used. For example, gallium phosphide (GaP) can be used as the first compound semiconductor layer 140. Hereinafter, the first compound semiconductor layer 140 is assumed to be a semiconductor constituted by GaP. The first compound semiconductor layer 140 containing GaP can be disposed as a buffer layer when the second compound semiconductor layer 150 described later is formed on the silicon substrate 110. Furthermore, the first compound semiconductor layer 140 can have i-type and n-type conductivity types.

The second compound semiconductor layer 150 is a compound semiconductor layer stacked on the first compound semiconductor layer 140. The second compound semiconductor layer 150 has a predetermined film thickness, for example, a film thickness of 1 μm or more, and is a semiconductor layer that generates an interaction with light, such as photoelectric conversion. For the second compound semiconductor layer 150, for example, a compound semiconductor containing Ga, arsenic (As), P, and nitrogen (N) can be used. For example, a GaAsPN semiconductor can be used as the second compound semiconductor layer 150. The GaAsPN semiconductor is a semiconductor having a small difference in lattice constant from Si constituting the silicon substrate 110 and capable of absorbing visible light. The second compound semiconductor layer 150 can have an i-type conductivity type. Furthermore, the second compound semiconductor layer 150 can have an n-type conductivity type. Note that the second compound semiconductor layer 150 preferably has a film thickness of 3 μm or more. This is because sufficient light absorption can be performed, and efficiency of photoelectric conversion is improved.

The electrode 121 is an electrode disposed on a surface of the silicon substrate 110 different from a surface on which the first compound semiconductor layer 140 is formed. The electrode 121 controls movement of charges between the silicon substrate 110 and the second compound semiconductor layer 150 via the first compound semiconductor layer 140. The electrode 121 can be constituted by, for example, metal such as copper (Cu) or aluminum (Al), a semiconductor, or polycrystalline silicon.

The second electrode 170 is an electrode disposed adjacent to the second compound semiconductor layer 150. The second electrode 170 is an electrode in which a voltage for controlling movement of charges of the first compound semiconductor layer 140 is applied between the electrode 121 and the second electrode 170. The second electrode 170 can be constituted by a member similar to the electrode 121. Furthermore, when the semiconductor element 100 is used as an optical semiconductor, the second electrode 170 can be constituted by a transparent electrode such as indium tin oxide (ITO).

As described above, the first compound semiconductor layer 140 containing GaP can be used as a buffer layer. This is because the first compound semiconductor layer 140 containing GaP has a small difference in lattice constant from Si constituting the silicon substrate 110. Furthermore, the second compound semiconductor layer 150 can be formed on the silicon substrate 110 by epitaxial growth. However, during this epitaxial growth, N contained in the second compound semiconductor layer 150 reacts with the silicon substrate 110 to change properties of a surface of the silicon substrate 110. By disposing the first compound semiconductor layer 140, it is possible to prevent adhesion of N contained in the second compound semiconductor layer 150 to the surface of the silicon substrate 110 and to prevent change in the properties of the surface of the silicon substrate 110. Furthermore, by disposing the first compound semiconductor layer 140, the first compound semiconductor layer 140 absorbs a difference in thermal expansion coefficient between the silicon substrate 110 and the second compound semiconductor layer 150, and stress at the time of forming the second compound semiconductor layer 150 can be reduced.

The first compound semiconductor layer 140 preferably has a film thickness not exceeding a critical film thickness of the silicon substrate 110. Here, the critical film thickness is a film thickness at which the first compound semiconductor layer 140 can absorb a difference in lattice constant from Si as accumulation of internal stress of the first compound semiconductor layer 140. When the first compound semiconductor layer 140 having a film thickness exceeding the critical film thickness is formed, the first compound semiconductor layer 140 cannot absorb a difference in lattice constant between the silicon substrate 110 and the first compound semiconductor layer 140, and crystal defects (dislocations) due to misfit occur in the first compound semiconductor layer 140. As the critical film thickness of the first compound semiconductor layer 140, a film thickness of 20 nm can be applied.

When the semiconductor element 100 is applied to a light receiving element, light is made incident on the second compound semiconductor layer 150 via the second electrode 170. The incident light generates charges due to a photoelectric effect in the second compound semiconductor layer 150. In this case, the electrode 121 controls movement of the generated charges. Specifically, the control circuit 2 generates a control signal for moving the charges generated in the second compound semiconductor layer 150 to the silicon substrate 110, and supplies the control signal to the electrode 121. Therefore, a control signal is applied between the electrode 121 and the second electrode 170. This control voltage is applied as a bias voltage to the first compound semiconductor layer 140 and the second compound semiconductor layer 150. The charges generated in the second compound semiconductor layer 150 are moved by this control signal. For example, in a case where a positive control voltage with respect to the ground potential is applied to the electrode 121, electrons out of charges generated by photoelectric conversion move to the silicon substrate 110 via the first compound semiconductor layer 140. Meanwhile, holes out of the charges generated by photoelectric conversion move to the second electrode 170.

In a case where the semiconductor element 100 is applied to a light emitting element, light generated when charges injected into the second compound semiconductor layer 150 disappear due to recombination is emitted to the outside via the second electrode 170. A control signal for controlling movement of charges to be recombined for light emission in the second compound semiconductor layer 150 is supplied to the electrode 121. Specifically, a drive voltage for injecting charges into the second compound semiconductor layer 150 is generated by the control circuit 2 and applied to the electrode 121.

In any case, in the semiconductor element 100, charges move via the first compound semiconductor layer 140. A difference in bandgap between the first compound semiconductor layer 140 and each of the silicon substrate 110 and the second compound semiconductor layer 150 is a problem. This is because a barrier generated by the difference in band gap inhibits movement of charges.

[Band Structure of Semiconductor Element]

Figure 2A:
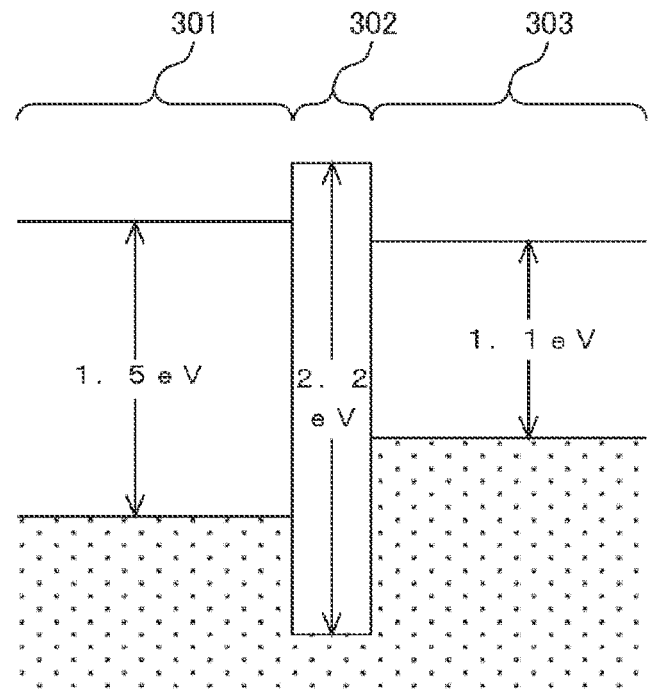
FIGS. 2A and 2B are diagrams illustrating an example of a band structure of a semiconductor element according to an embodiment of the present disclosure.
Figure 2B:
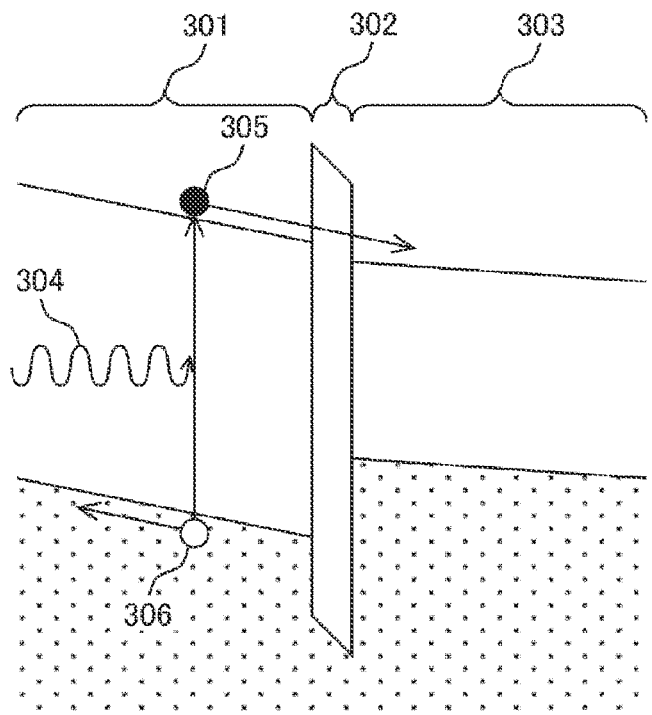

FIGS. 2A and 2B are diagrams illustrating an example of a band structure of a semiconductor element according to an embodiment of the present disclosure FIGS. 2A and 2B are diagrams illustrating an example of a band structure of the semiconductor element 100. In FIGS. 2A and 2B, a region 301 represents a region of the second compound semiconductor layer 150, a region 302 represents a region of the first compound semiconductor layer 140, and a region 303 represents a region of the silicon substrate 110.

FIG. 2A is a diagram illustrating a band structure in a case where no control voltage is applied. A band gap of the second compound semiconductor layer 150 in the region 301 is approximately 1.5 eV, and a band gap of the silicon substrate 110 in the region 303 is 1.1 eV. Meanwhile, a band gap of the first compound semiconductor layer 140 in the region 302 is 2.2 eV, which is wider than the band gaps of the second compound semiconductor layer 150 and the silicon substrate 110. Therefore, this acts as a barrier when electrons in a conduction band move from the second compound semiconductor layer 150 (region 301) to the silicon substrate 110 (region 303), and inhibits the movement. Therefore, a moving speed also decreases.

FIG. 2B is a diagram illustrating an example in a case where a control voltage is applied. When a positive control voltage with respect to the second electrode 170 is applied to the electrode 121 and a bias voltage is supplied thereto, the potential changes and the region 302 becomes thin. When a photoelectric effect is generated by incident light 304 incident on the region 301, electrons 305 out of generated charges pass through the region 302 by a tunneling effect and move to the silicon substrate 110 in the region 303. This tunneling effect makes movement of the electrons 305 possible. Note that holes 306 out of the charges generated by the photoelectric effect move inside the region 301 and reach the second electrode 170. Such a tunneling effect can be obtained by reducing the film thickness of the first compound semiconductor layer 140 in the region 302. Specifically, by setting the film thickness of the first compound semiconductor layer 140 in the region 302 to 50 nm or less, a remarkable tunneling effect can be generated. Note that as a mechanism of the above-described tunneling effect, a mechanism such as direct tunneling or fowler-nordheim (FN) tunneling is considered and the mechanism is not limited to one tunneling. In any case, the thin film thickness of the first compound semiconductor layer 140 is a factor of the mechanism of the tunneling effect.

As described above, even in a case where the first compound semiconductor layer 140 containing GaP having a wide band gap is disposed, by reducing the film thickness of the first compound semiconductor layer 140 and applying a control voltage via the electrode 121, an influence of an energy barrier generated by the difference in band gap can be reduced.

The semiconductor element 100 can be manufactured through the following steps. The silicon substrate 110 is formed into an n-type conductivity type, and a surface on which the first compound semiconductor layer 140 is to be disposed is subjected to surface treatment and thermal cleaning. Next, the first compound semiconductor layer 140 is formed on the silicon substrate 110. The first compound semiconductor layer 140 can be formed by, for example, molecular beam epitaxy (MBE), atomic layer deposition (ALD), or metal organic chemical vapor deposition (MOCVD). The second compound semiconductor layer 150 is stacked on the first compound semiconductor layer 140. The second compound semiconductor layer 150 can be formed by epitaxial growth. The second electrode 170 is stacked on the second compound semiconductor layer 150. The second electrode 170 can be formed by, for example, sputtering. Next, the electrode 121 is formed on the silicon substrate 119. The electrode 121 can be formed by, for example, sputtering. Through the above steps, the semiconductor element 100 can be manufactured.

As described above, in the semiconductor element 100 according to the first embodiment of the present disclosure, the first compound semiconductor layer 140 is disposed as a buffer layer, and the electrode 121 is disposed on the silicon substrate 110. By applying, to the electrode 121, a control voltage for controlling movement of charges from the second compound semiconductor layer 150 to the silicon substrate 110, it is possible to reduce a barrier when charges are move from the second compound semiconductor layer 150 to the silicon substrate 110. This makes it possible to improve movement of charges.

2. Second Embodiment

The semiconductor element 100 according to the above-described first embodiment includes a two-layered compound semiconductor. Meanwhile, a semiconductor element 100 according to a second embodiment of the present disclosure is different from that of the above-described first embodiment in including a three-layered compound semiconductor.

[Configuration of Semiconductor Element]

Figure 3:
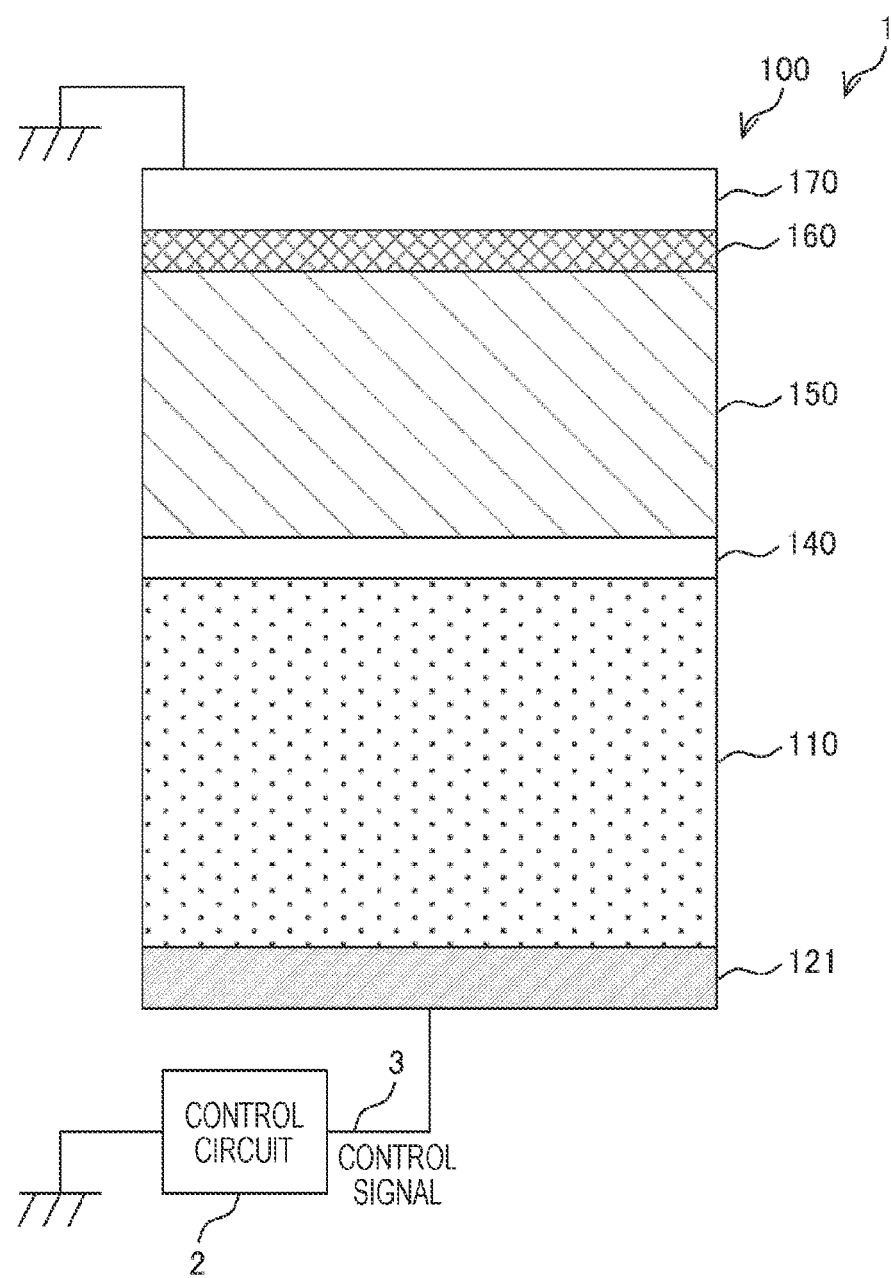
FIG. 3 is a diagram illustrating a configuration example of a semiconductor device according to a second embodiment of the present disclosure.

FIG. 3 is a diagram illustrating a configuration example of a semiconductor device according to the second embodiment of the present disclosure. FIG. 3 is a diagram illustrating a configuration example of a semiconductor device 1 and the semiconductor element 100 similarly to FIG. 1. The semiconductor element 100 in FIG. 3 is different from the semiconductor element 100 in FIG. 1 in further including a p-type third compound semiconductor layer 160.

The third compound semiconductor layer 160 is a compound semiconductor layer disposed between a second compound semiconductor layer 150 and a second electrode 170. For the third compound semiconductor layer 160, a compound semiconductor containing Ga, As, P, and N can be used similarly to the second compound semiconductor layer 150. Furthermore, the third compound semiconductor layer 160 can have a conductivity type different from the second compound semiconductor layer 150. For example, the third compound semiconductor layer 160 can have a p-type. By disposing the third compound semiconductor layer 160 adjacent to the i-type second compound semiconductor layer 150, the pin-junction semiconductor element 100 can be formed. A depletion layer can be formed in a region of the second compound semiconductor layer 150, and recombination of charges generated by a photoelectric effect can be suppressed.

Furthermore, in the semiconductor element 100 in FIG. 3, the second compound semiconductor layer 150 can have an n-type conductivity type. In this case, the pn-junction semiconductor element 100 can be formed, and a depletion layer is formed at an interface between the second compound semiconductor layer 150 and the third compound semiconductor layer 160.

Furthermore, as the third compound semiconductor layer 160, a compound semiconductor layer whose band gap has become wider by changing a mixed crystal ratio of GaAsPN constituting the second compound semiconductor layer 150 can also be used. In this case, the semiconductor element 100 has a double hetero structure.

The third compound semiconductor layer 160 has a relatively thin film thickness. This is because the third compound semiconductor layer 160 needs to transmit incident light, and an influence of a contact interface with the electrode 170 is reduced. Specifically, the third compound semiconductor layer 160 can have a film thickness of about 100 nm or less.

Since the configuration of the semiconductor element 100 other than this is similar to the configuration of the semiconductor element 100 described in the first embodiment of the present disclosure, description thereof will be omitted.

As described above, the semiconductor element 100 according to the second embodiment of the present disclosure forms a depletion layer by disposing the third compound semiconductor layer 160 having a conductivity type different from the second compound semiconductor layer 150. Therefore, recombination of charges generated by a photoelectric effect can be reduced, and conversion efficiency can be improved.

3. Third Embodiment

Figure 4:
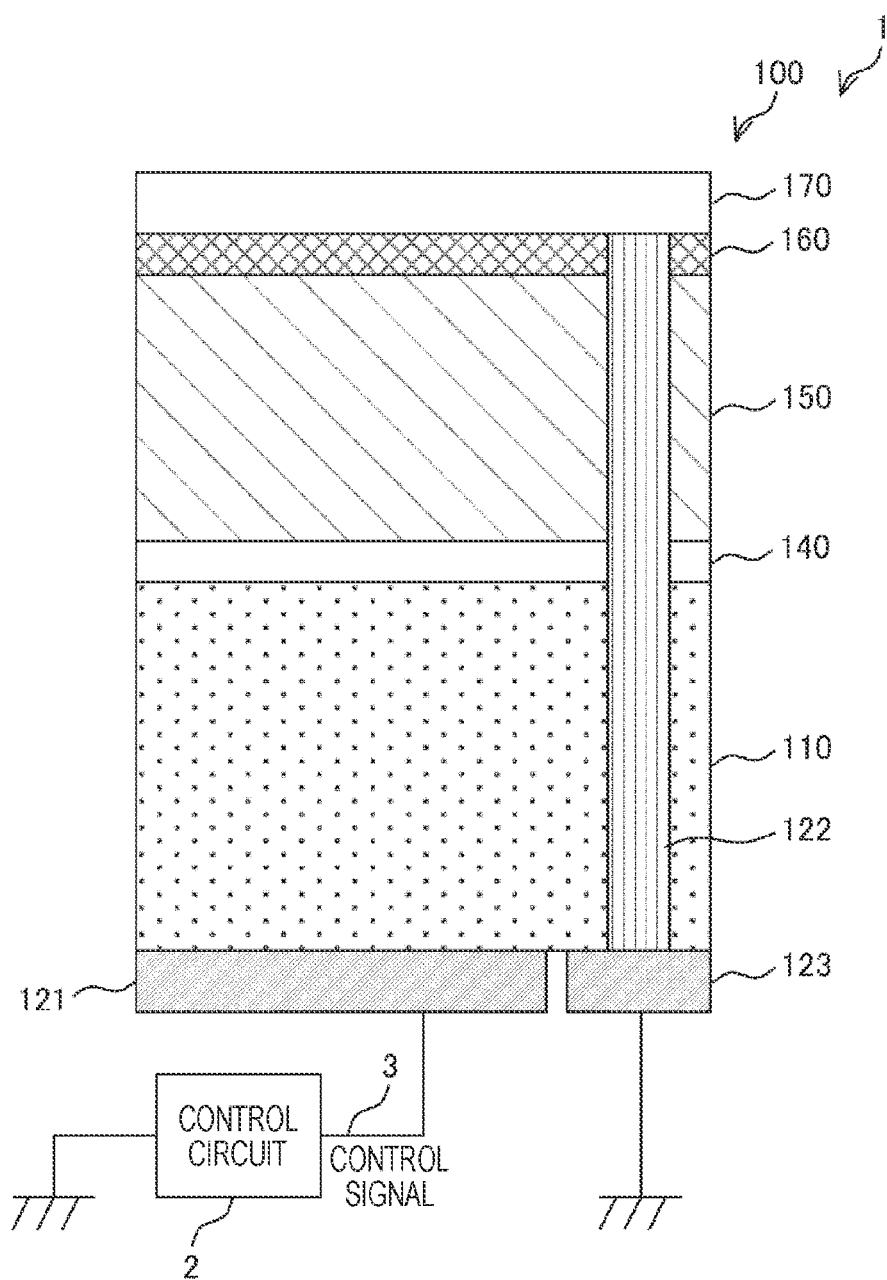
FIG. 4 is a diagram illustrating a configuration example of a semiconductor device according to a third embodiment of the present disclosure.

In the semiconductor element 100 according to the above-described second embodiment, the second electrode 170 is directly grounded. Meanwhile, a semiconductor element 100 according to a third embodiment of the present disclosure is different from that of the above-described second embodiment in being grounded via a second electrode 170 and an electrode penetrating a silicon substrate 110.
[Configuration of Semiconductor Element]
FIG. 4 is a diagram illustrating a configuration example of a semiconductor device according to the third embodiment of the present disclosure. FIG. 4 is a diagram illustrating a configuration example of a semiconductor device 1 and the semiconductor element 100 similarly to FIG. 3. The semiconductor element 100 in FIG. 4 is different from the semiconductor element 100 in FIG. 3 in that a through electrode 122 and an electrode 123 are further disposed.

The electrode 123 is an electrode disposed adjacent to a surface of the silicon substrate 110. The electrode 123 is grounded on the surface of the silicon substrate 110. The electrode 123 can be connected to the ground line in common with a control circuit 2. Note that the configuration of the semiconductor device 1 in FIG. 4 is not limited to this example. For example, it is also possible to adopt a configuration in which the electrode 123 is set to a potential other than the ground potential.

The through electrode 122 is an electrode disposed so as to penetrate the silicon substrate 110 and a compound semiconductor layer, and is an electrode disposed between a second electrode 170 and the electrode 123. The through electrode 122 can be formed by disposing an insulating film (not illustrated) on an inner wall of a through hole formed in the silicon substrate 110 and the compound semiconductor layer and embedding a conductive material such as metal therein. The through electrode 122 can be formed in the silicon substrate 110 and the compound semiconductor layer after the second electrode 170 is formed. Alternatively, the second electrode 170 can be formed after the through electrode 122 is formed in the silicon substrate 110 and the compound semiconductor layer.

Since the configuration of the semiconductor element 100 other than this is similar to the configuration of the semiconductor element 100 described in the third embodiment of the present disclosure, description thereof will be omitted.

As described above, the semiconductor element 100 according to the third embodiment of the present disclosure electrically connects the second electrode 170 via the through electrode 122. The semiconductor element 100 according to the third embodiment can be connected to the ground line in common with the control circuit 2 to simplify wiring with the control circuit 2.

4. Fourth Embodiment

The semiconductor element 100 according to the above-described first embodiment is formed as an optical semiconductor element. Meanwhile, in a fourth embodiment of the present disclosure, an example in which a semiconductor element 100 is applied to an imaging element will be described.

Figure 5:
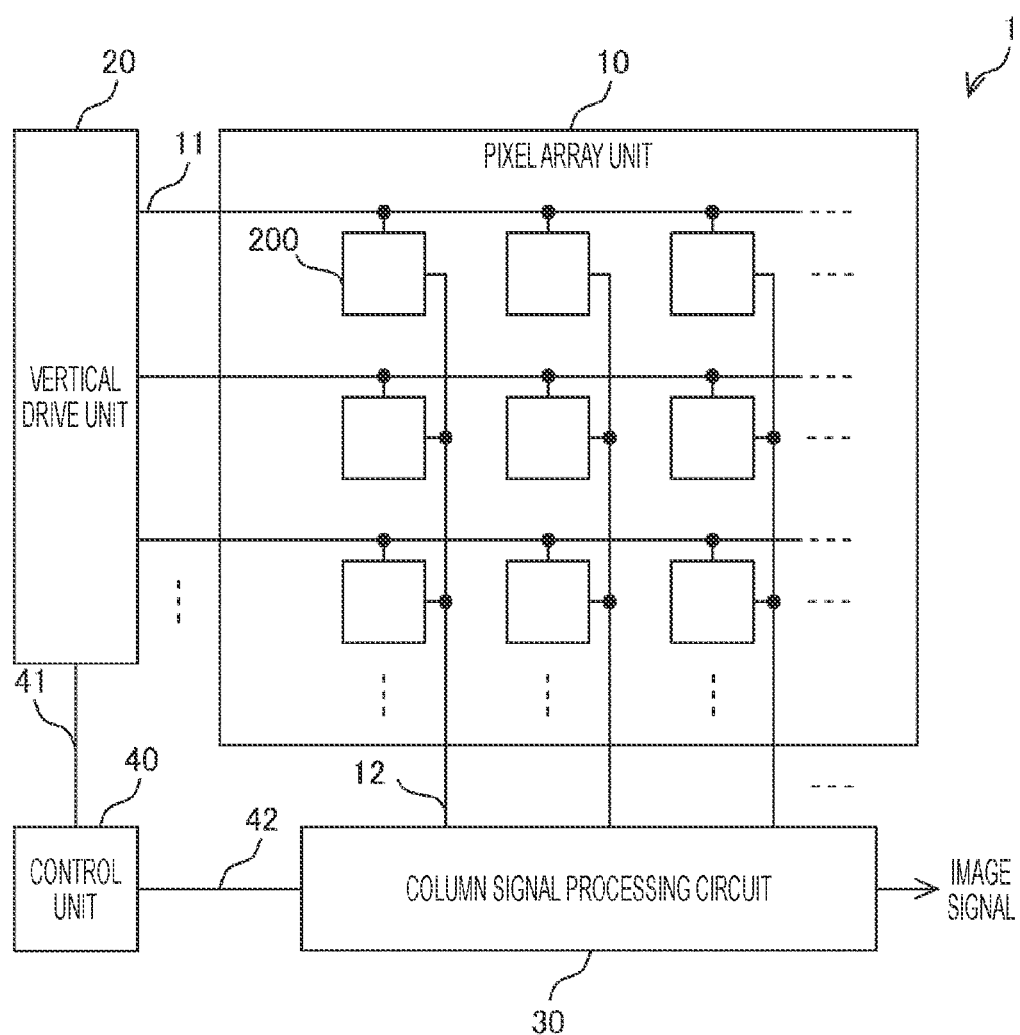
FIG. 5 is a diagram illustrating a configuration example of a semiconductor device according to a fourth embodiment of the present disclosure.

[Configuration of Imaging Element]
FIG. 5 is a diagram illustrating a configuration example of a semiconductor device according to the fourth embodiment of the present disclosure. A semiconductor device 1 in FIG. 5 constitutes an imaging device. The semiconductor device 1 includes a pixel array unit 10, a vertical drive unit 20, a column signal processing unit 30, and a control unit 40.

In the pixel array unit 10, pixels 200 are arranged in a two-dimensional lattice shape. Here, the pixel 200 generates an image signal corresponding to emitted light. The pixel 200 includes a photoelectric conversion unit that generates charges corresponding to emitted light. Furthermore, the pixel 200 further includes an image signal generation circuit. The image signal generation circuit generates an image signal based on charges generated by the photoelectric conversion unit. The generation of an image signal is controlled by a control signal generated by the vertical drive unit 20 described later. In the pixel array unit 10, signal lines 11 and 12 are arranged in an XY matrix shape. The signal line 11 is a signal line that transmits a control signal of the image signal generation circuit in the pixel 200, is arranged for each row of the pixel array unit 10, and is commonly wired to the pixels 200 arranged in each row. The signal line 12 is a signal line that transmits an image signal generated by the image signal generation circuit of the pixel 200, is arranged for each column of the pixel array unit 10, and is commonly wired to the pixels 200 arranged in each column.

The vertical drive unit 20 generates a control signal of the image signal generation circuit of the pixel 200. The vertical drive unit 20 transmits the generated control signal to the pixel 200 via the signal line 11 in FIG. 5. The column signal processing unit 30 processes the image signal generated by the pixel 200. The column signal processing unit 30 processes the image signal transmitted from the pixel 200 via the signal line 12 in FIG. 5. The processing in the column signal processing unit 30 corresponds to, for example, analog-to-digital conversion for converting an analog image signal generated in the pixel 200 into a digital image signal. The image signal processed by the column signal processing unit 30 is output as an image signal of the semiconductor device 1. The control unit 40 controls the entire semiconductor device 1. The control unit 40 controls the semiconductor device 1 by generating and outputting a control signal for controlling the vertical drive unit 20 and the column signal processing unit 30. The control signal generated by the control unit 40 is transmitted to the vertical drive unit 20 and the column signal processing unit 30 by signal lines 41 and 42, respectively.

Figure 6:
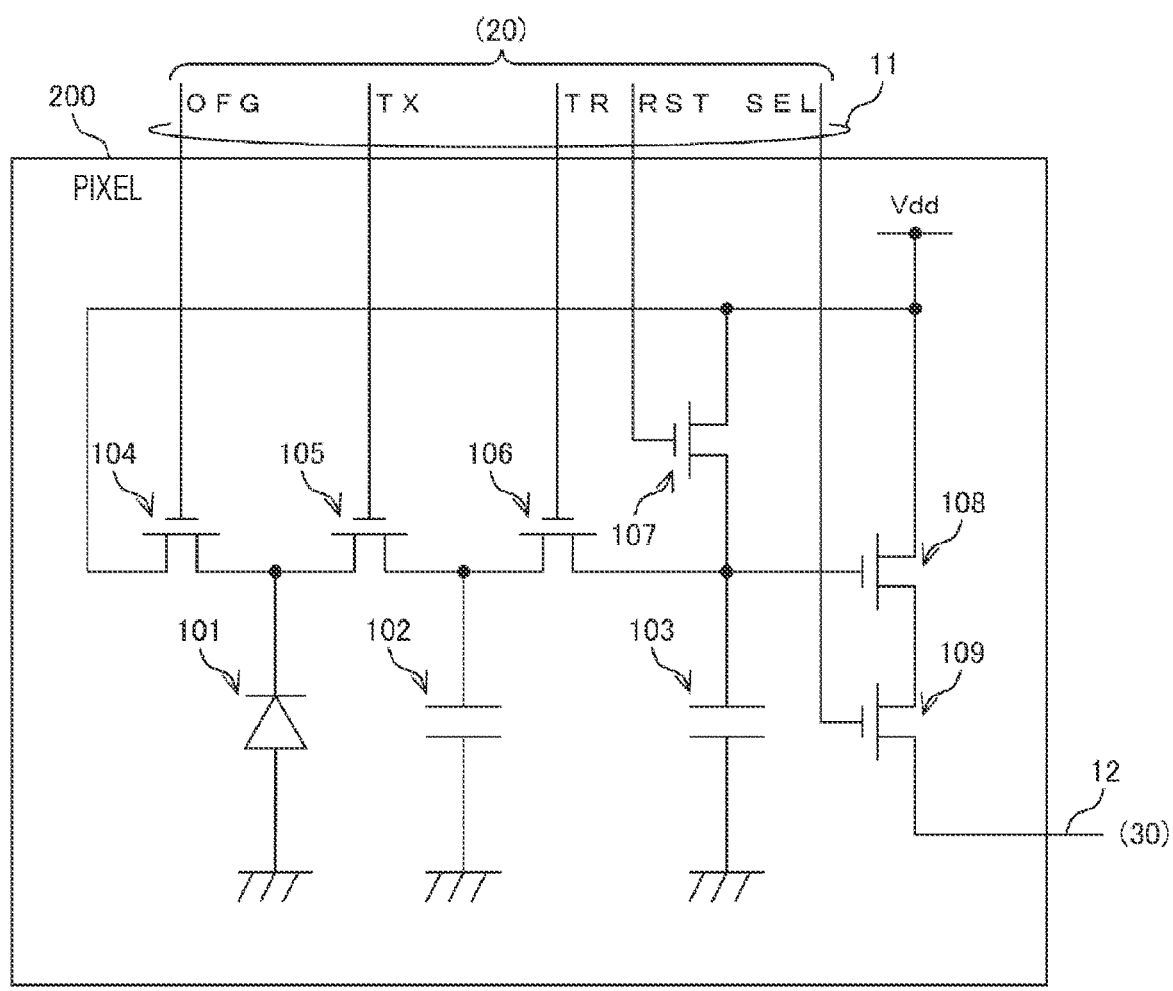
FIG. 6 is a diagram illustrating an example of a circuit configuration of a pixel according to the fourth embodiment of the present disclosure.

The photoelectric conversion unit, the image signal generation circuit, the vertical drive unit 20, and the like can be formed in a silicon substrate 119 described later. Furthermore, for the vertical drive unit 20 and the like, a circuit constituted by a complementary metal oxide semiconductor (CMOS) can be adopted.
[Circuit Configuration of Pixel]
FIG. 6 is a diagram illustrating an example of a circuit configuration of a pixel according to the fourth embodiment of the present disclosure. FIG. 6 is a circuit diagram illustrating a configuration of the pixel 200. The pixel 200 in FIG. 6 includes a photoelectric conversion unit 101, a first charge holding unit 103, a second charge holding unit 102, and MOS transistors 104 to 109. Furthermore, the signal line 11 including signal lines OFG, TX, TR, RST, and SEL and the signal line 12 are wired to the pixel 200. The signal lines OFG, TX, TR, RST, and SEL constituting the signal line 11 are signal lines for transmitting a control signal of the pixel 200. These signal lines are connected to gates of the MOS transistors. By applying a voltage equal to or higher than a threshold between a gate and a source to a MOS transistor via these signal lines, the MOS transistor can be made conductive. Meanwhile, the signal line 12 transmits an image signal generated by the pixel 200. Furthermore, a power supply line Vdd is wired to the pixel 200, and power is supplied to the pixel 200. Note that the first charge holding unit 103, the second charge holding unit 102, and the MOS transistors 104 to 109 constitute the image signal generation circuit described in FIG. 5.

An anode of the photoelectric conversion unit 101 is grounded, and a cathode of the photoelectric conversion unit 101 is connected to each of sources of the MOS transistors 104 and 105. A drain of the MOS transistor 104 is connected to the power supply line Vdd, and a gate of the MOS transistor 104 is connected to the signal line OFG. A drain of the MOS transistor 105 is connected to a source of the MOS transistor 106 and one end of the second charge holding unit 102. The other end of the second charge holding unit 102 is grounded. A gate of the MOS transistor 105 is connected to the signal line TX, and a gate of the MOS transistor 106 is connected to the signal line TR. A drain of the MOS transistor 106 is connected to a source of the MOS transistor 107, a gate of the MOS transistor 108, and one end of the first charge holding unit 103. The other end of the first charge holding unit 103 is grounded. A gate of the MOS transistor 107 is connected to the signal line RST. Drains of the MOS transistors 107 and 108 are commonly connected to the power supply line Vdd, and a source of the MOS transistor 108 is connected to a drain of the MOS transistor 109. A source of the MOS transistor 109 is connected to the signal line 12, and a gate of the MOS transistor 109 is connected to the signal line SEL.

The photoelectric conversion unit 101 generates and holds charges corresponding to emitted light as described above. As the photoelectric conversion unit 101, a photodiode can be used.

The MOS transistor 104 is a transistor that resets the photoelectric conversion unit 101. By applying a power supply voltage to the photoelectric conversion unit 101, the MOS transistor 104 discharges charges held in the photoelectric conversion unit 101 to the power supply line Vdd and resets the photoelectric conversion unit 101. The reset of the photoelectric conversion unit 101 by the MOS transistor 104 is controlled by a signal transmitted by the signal line OFG.

The MOS transistor 105 is a transistor that transfers charges generated by photoelectric conversion of the photoelectric conversion unit 101 to the second charge holding unit 102. The charge transfer by the MOS transistor 105 is controlled by a signal transmitted by the signal line TX.

The second charge holding unit 102 is a capacitor that holds the charges transferred by the MOS transistor 105.

The MOS transistor 106 is a transistor that transfers the charges held in the second charge holding unit 102 to the first charge holding unit 103. The charge transfer by the MOS transistor 106 is controlled by a signal transmitted by the signal line TR.

The MOS transistor 108 is a transistor that generates a signal based on charges held in the first charge holding unit 103. The MOS transistor 109 is a transistor that outputs the signal generated by the MOS transistor 108 as an image signal to the signal line 12. The MOS transistor 109 is controlled by a signal transmitted by the signal line SEL.

The MOS transistor 107 is a transistor that resets the first charge holding unit 103 by discharging the charges held in the first charge holding unit 103 to the power supply line Vdd. The reset by the MOS transistor 107 is controlled by a signal transmitted by the signal line RST.

Generation of an image signal in the pixel 200 in FIG. 6 can be performed as follows. First, the MOS transistor 104 is made conductive to reset the photoelectric conversion unit 101. Charges generated by photoelectric conversion after the reset are accumulated in the photoelectric conversion unit 101. After a lapse of a predetermined time, the MOS transistors 106 and 107 are made conductive to reset the second charge holding unit 102. Next, the MOS transistor 105 is made conductive. Therefore, charges generated in the photoelectric conversion unit 101 are transferred to and held in the second charge holding unit 102.

The operation from the reset of the photoelectric conversion unit 101 to the charge transfer by the MOS transistor 105 is simultaneously performed in all the pixels 200 arranged in the pixel array unit 10. That is, global reset, which is simultaneous reset in all the pixels 200, and simultaneous charge transfer in all the pixels 200 are executed. Therefore, global shutter is implemented. Note that a period from the reset of the photoelectric conversion unit 101 to the charge transfer by the MOS transistor 105 corresponds to an exposure period.

Next, the MOS transistor 107 is made conductive again to reset the first charge holding unit 103. Next, the MOS transistor 106 is made conductive, and charges held in the second charge holding unit 102 are transferred to and held in the first charge holding unit 103. Therefore, the MOS transistor 108 generates an image signal corresponding to the charges held in the first charge holding unit 103. Next, by making the MOS transistor 109 conductive, the image signal generated by the MOS transistor 108 is output to the signal line 12. This operation from the reset of the first charge holding unit 103 to the output of the image signal is sequentially performed for each row of the pixel array unit 10 in which the pixels 200 are arranged. By outputting image signals in the pixels 200 in all the rows of the pixel array unit 10, a frame that is an image signal for one screen is generated and output from the semiconductor device 1.

By generating and outputting an image signal in the pixel 200 in parallel with the above-described exposure period, time required for imaging and transfer of the image signal can be shortened. Furthermore, by simultaneously performing exposure in all the pixels 200 in the pixel array unit 10, it is possible to prevent occurrence of frame distortion and to improve image quality. As described above, the second charge holding unit 102 is used to temporarily hold charges generated by the photoelectric conversion unit 101 when global shutter is performed.

[Configuration of Pixel]

Figure 7:
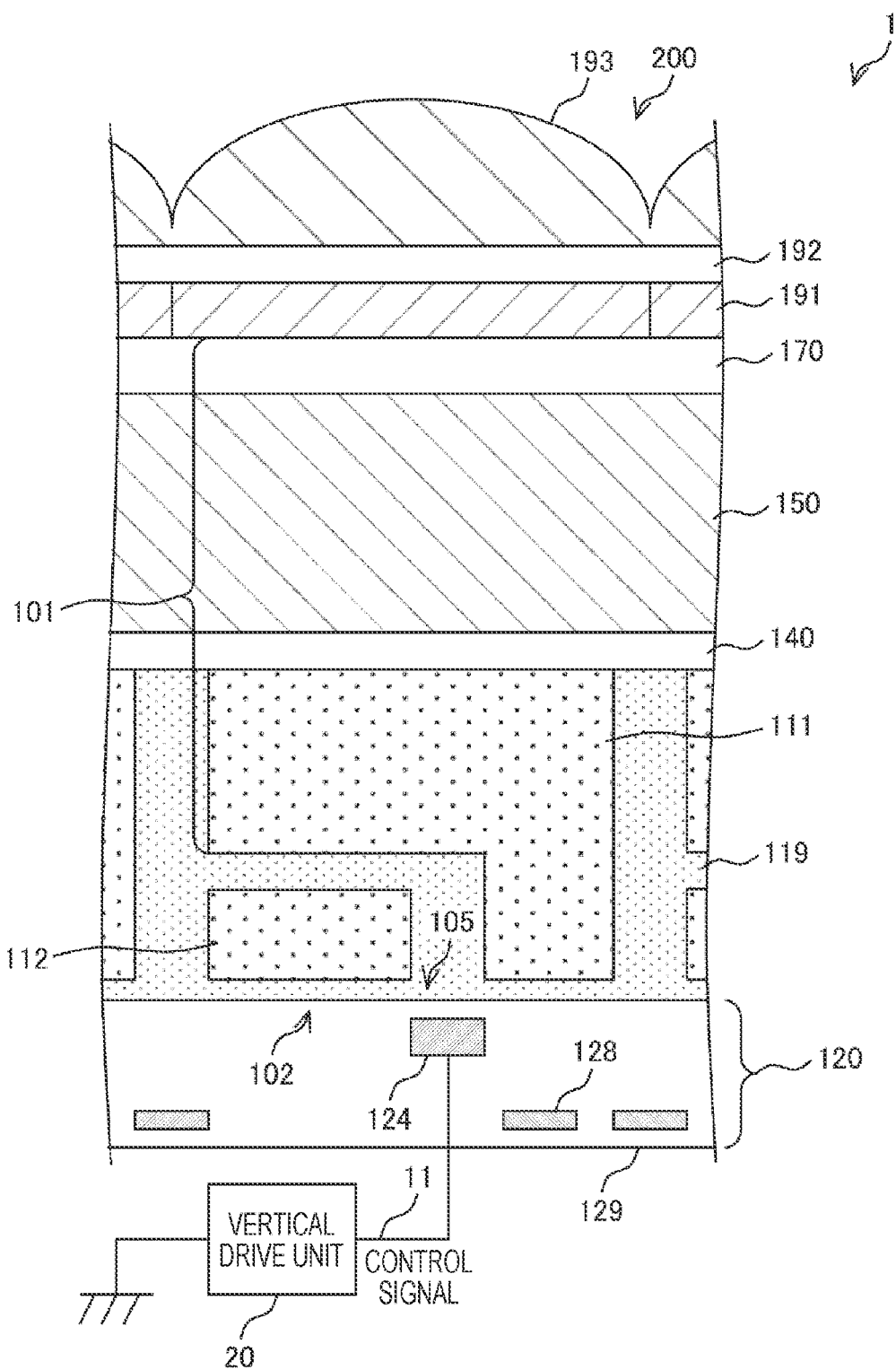
FIG. 7 is a diagram illustrating a configuration example of the pixel according to the fourth embodiment of the present disclosure.

FIG. 7 is a diagram illustrating a configuration example of the pixel according to the fourth embodiment of the present disclosure. FIG. 7 is a diagram illustrating a configuration example of the pixel 200. The pixel 200 in FIG. 7 includes a silicon substrate 119, a wiring region 120, a first compound semiconductor layer 140, a second compound semiconductor layer 150, a second electrode 170, a color filter 191, a planarizing film 192, and an on-chip lens 193.

The silicon substrate 119 is a substrate constituted by Si, and is a semiconductor substrate in which diffusion regions of semiconductor elements included in the image signal generation circuit of the pixel 200, the vertical drive unit 20, the column signal processing unit 30, and the control unit 40 described in FIG. 5 are formed. The diffusion regions of the semiconductor elements such as the image signal generation circuit are disposed in a well region formed in the silicon substrate 110. For convenience, the silicon substrate 110 in FIG. 7 is assumed to constitute a p-type well region. By forming an n-type semiconductor region in the p-type well region, the diffusion regions of the semiconductor elements such as the image signal generation circuit can be formed. In FIG. 7, the vertical drive unit 20 described in FIG. 5, and the photoelectric conversion unit 101, the second charge holding unit 102, and the MOS transistor 105 described in FIG. 6 are illustrated as examples of the semiconductor elements.

An n-type semiconductor region 111 of the silicon substrate 119 in FIG. 7 is a semiconductor region corresponding to the silicon substrate 110 described in FIG. 1. Note that the semiconductor element including the n-type semiconductor region 111, the first compound semiconductor layer 140, the second compound semiconductor layer 150, and the second electrode 170 in FIG. 7 constitutes the photoelectric conversion unit 101, and corresponds to the semiconductor element 100 described in FIG. 1.

An n-type semiconductor region 112 of the silicon substrate 119 in FIG. 7 constitutes the second charge holding unit 102. Furthermore, the n-type semiconductor regions 111 and 112 and a gate electrode 124 described later constitute the MOS transistor 105. That is, the n-type semiconductor regions 111 and 112 correspond to a source region and a drain region of the MOS transistor 105, respectively, and the p-type well region between the n-type semiconductor regions 111 and 112 corresponds to a channel region. Furthermore, the signal line 11 in FIG. 7 corresponds to the signal line TX in FIG. 6.

The wiring region 120 is a region where wiring for transmitting a signal to an element such as the MOS transistor 105 is formed. The wiring region 120 includes a wiring layer 128 and an insulating layer 129. The wiring layer 128 transmits a signal to an element. The wiring layer 128 can be constituted by metal such as copper (Cu). The insulating layer 129 insulates the wiring layer 128. The insulating layer 129 can be constituted by, for example, silicon oxide ($SiO_2$). The wiring region 120 further includes the gate electrode 124 of the MOS transistor 105. The insulating layer 129 between the gate electrode 124 and the silicon substrate 119 constitutes a gate insulating film. The gate electrode 124 in FIG. 7 is disposed adjacent to the silicon substrate 119 via the gate insulating film.

The color filter 191 is an optical filter that transmits an incident light beam having a predetermined wavelength among light beams incident on the pixel 200. As the color filter 191, one of three types of color filters 191 that transmit red light, green light, and blue light can be disposed in the pixel 200.

The planarizing film 192 is a film that planarizes a surface. The planarizing film 192 in FIG. 7 is stacked on the color filter 191 and planarizes a surface on which the on-chip lens 193 described later is to be formed.

The on-chip lens 193 is a lens that condenses incident light. The on-chip lens 193 in FIG. 7 is formed in a hemispherical shape and condenses incident light on the photoelectric conversion unit 101.

Configurations of the first compound semiconductor layer 140, the second compound semiconductor layer 150, and the second electrode 170 are similar to those of the semiconductor element 100 in FIG. 1, and therefore description thereof will be omitted.

Incident light incident through the on-chip lens 193, the color filter 191, and the second electrode 170 causes photoelectric conversion in the second compound semiconductor layer 150 to generate charges. As described in FIG. 6, when the second charge holding unit 102 is reset, a positive power supply voltage is applied to the second charge holding unit 102. Therefore, the potential of the n-type semiconductor region 112 in FIG. 7 becomes positive by the reset. When a control signal for making the MOS transistor 105 conductive is applied to the gate electrode 124 via the signal line TX, the n-type semiconductor regions 111 and 112 are made conductive with each other, and the potential of the n-type semiconductor region 111 also becomes positive. Therefore, the n-type semiconductor region 111 is reset to a depletion state.

The positive voltage of the n-type semiconductor region 111 is applied to the second compound semiconductor layer 150 via the first compound semiconductor layer 140. Charges (electrons) generated by photoelectric conversion in the second compound semiconductor layer 150 move to the n-type semiconductor region 111 via the first compound semiconductor layer 140. When a control signal is applied to the gate electrode 124, the voltage of the n-type semiconductor region 111 changes, and an electric field for moving charges of the compound semiconductor layer changes. That is, the electric field of the compound semiconductor layer or the like is indirectly controlled by the control signal applied to the gate electrode 124, and movement of charges is controlled.

As described above, the gate electrode 124 controls movement of charges between the n-type semiconductor region 111 and the second compound semiconductor layer 150 via the first compound semiconductor layer 140. Note that the gate electrode 124 is an example of an electrode described in claims. The n-type semiconductor region 111 is an example of a silicon substrate described in claims. The vertical drive unit 20 is an example of a control circuit described in claims.

Furthermore, the pixel 200 adopts a configuration in which the second compound semiconductor layer 150 performs photoelectric conversion of incident light, and a semiconductor element formed in the silicon substrate 119 holds charges generated by photoelectric conversion and transferred to the silicon substrate 119 and generates an image signal. Therefore, an existing processing circuit formed in the silicon substrate 119 and constituted by a CMOS or the like can be applied to the semiconductor device 1. Furthermore, since the second compound semiconductor layer 150 performs photoelectric conversion of incident light, a photoelectric conversion unit does not need to be disposed in the silicon substrate 119. Therefore, the size of the second charge holding unit 102 or the like disposed in the silicon substrate 119 can be increased, and charge accumulation capacity can be improved.

Note that the configuration of the pixel 200 is not limited to this example. For example, the pixel 200 can also adopt a configuration in which incident light having a wavelength that is not absorbed by the second compound semiconductor layer 150, such as infrared light, is photoelectrically converted by a photoelectric conversion unit disposed in the silicon substrate 110.

[Method for Manufacturing Semiconductor Device]

FIGS. 8A, 8B, 8O, 9A, 9B, and 9C are diagrams illustrating an example of a method for manufacturing the semiconductor device according to the fourth embodiment of the present disclosure. FIGS. 8A, 8B, 8C, 9A, 9B, and 9C are diagrams illustrating an example of a process for manufacturing the semiconductor device 1.

Figure 8A:
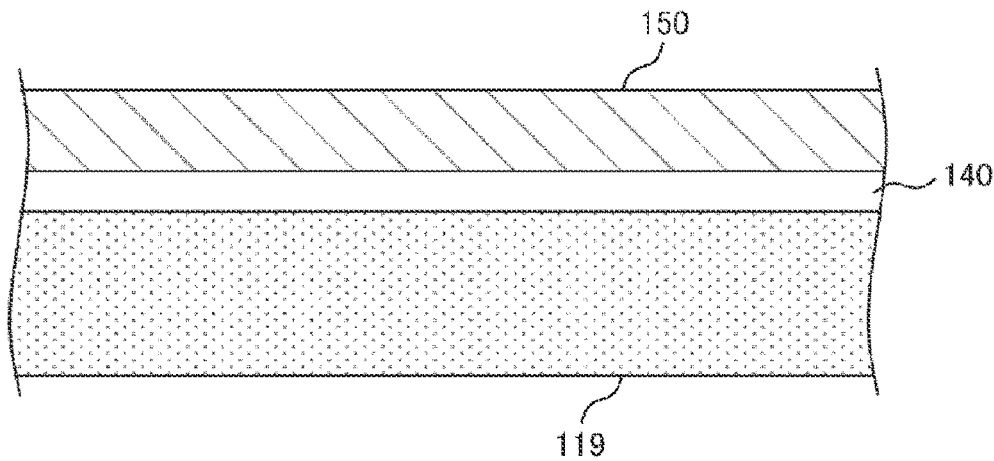
FIGS. 8A, 8B, and 8C are diagrams illustrating an example of a method for manufacturing the semiconductor device according to the fourth embodiment of the present disclosure.
Figure 8B:
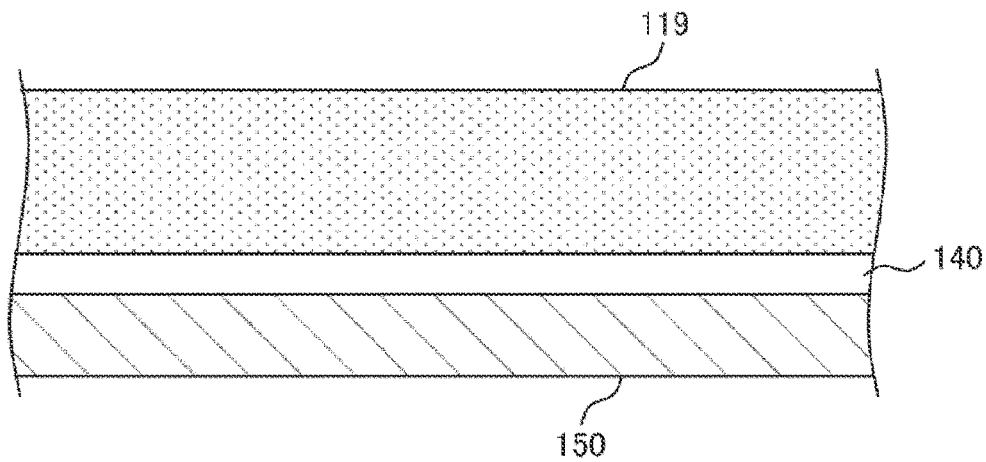

First, the first compound semiconductor layer 140 and the second compound semiconductor layer 150 are sequentially stacked on a back surface of the silicon substrate 119. The first compound semiconductor layer 140 can be formed by MBE. Furthermore, the second compound semiconductor layer 150 can be formed by epitaxial growth (FIG. 8A).

Figure 8C:
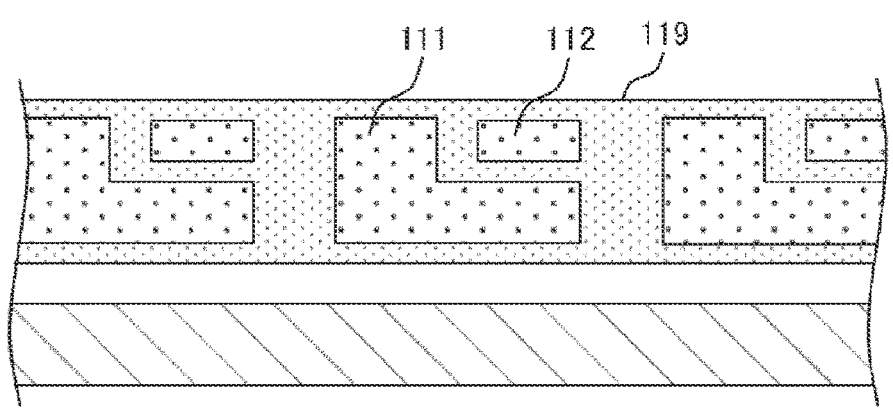

Next, the silicon substrate 119 is turned upside down (FIG. 8B), a p-type well region is formed in the silicon substrate 119, and the n-type semiconductor regions 111 and 112 are formed. This can be performed by ion implantation (FIG. 8C).

Figure 9A:
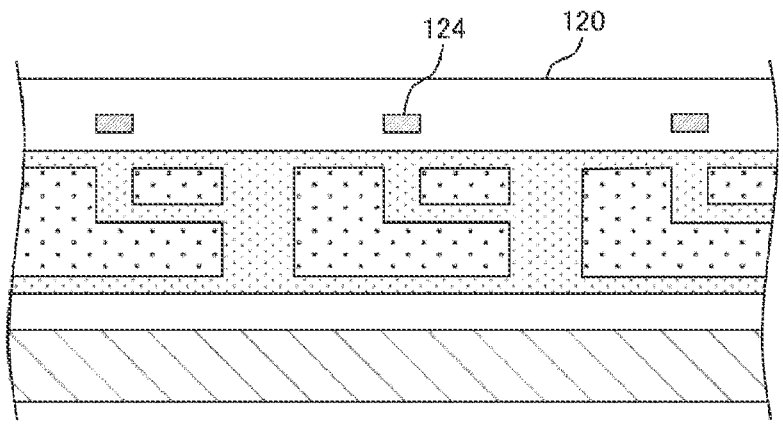
FIGS. 9A, 9B, and 9C are diagrams illustrating the example of the method for manufacturing the semiconductor device according to the fourth embodiment of the present disclosure.

Next, a gate insulating film is formed on a front surface of the silicon substrate 119, and the gate electrode 124 is formed. Next, the insulating layer 129 and the wiring layer 128 (not illustrated) are disposed to form the wiring region 120 (FIG. 9A).

Figure 9B:
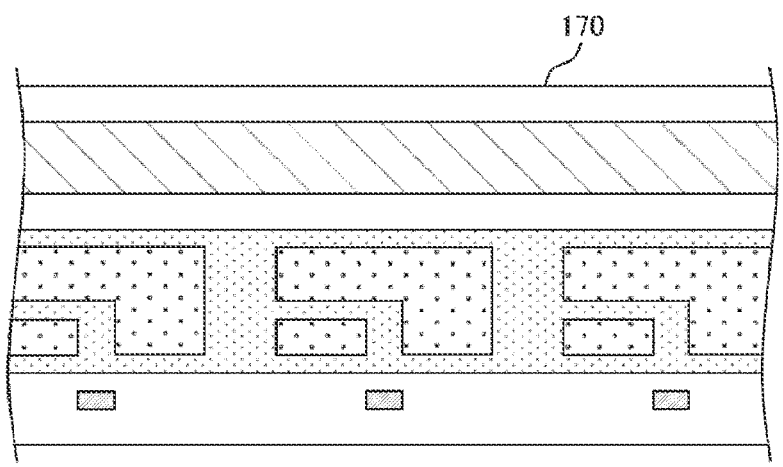

Next, the silicon substrate 119 is turned upside down again, and the second electrode 170 is stacked on the second compound semiconductor layer 150 (FIG. 9B).

Figure 9C:
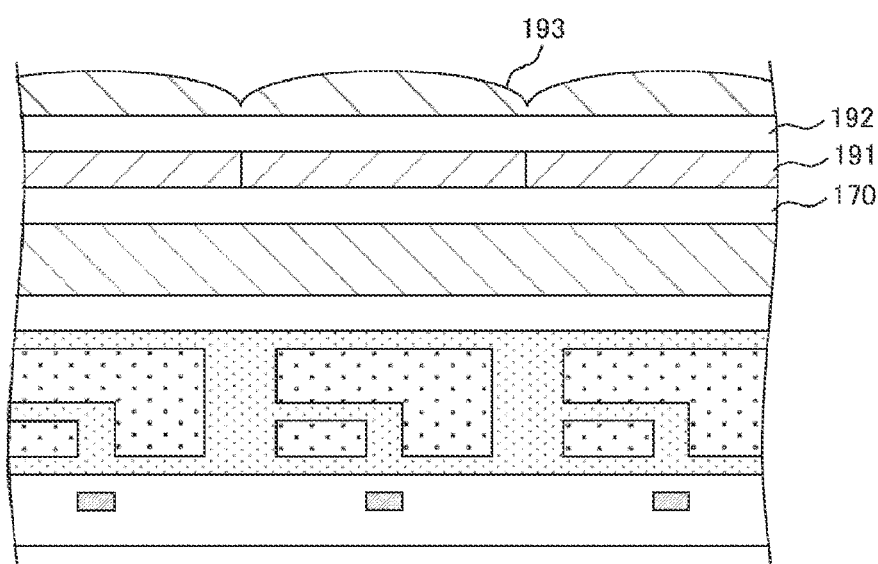

Next, the color filter 191 and the planarizing film 192 are stacked on the second electrode 170. Thereafter, the on-chip lens 193 is formed (FIG. 9C). Through the above steps, the semiconductor device 1 can be manufactured.

Note that a low-temperature process can also be adopted for the step of epitaxial growth of the second compound semiconductor layer 150. At this time, the following manufacturing process can also be adopted. A step of forming a diffusion region (FIG. 8C) and a step of forming the wiring region 120 (FIG. 9A) are performed on the silicon substrate 119. Next, the silicon substrate 119 is turned upside down, and a step of forming the first compound semiconductor layer 140 and the second compound semiconductor layer 150 (FIG. 8A) is performed.

As described above, in the semiconductor device 1 according to the fourth embodiment of the present disclosure, movement of charges generated in the second compound semiconductor layer 150 is controlled by a control signal applied to the gate electrode 124 of the MOS transistor 105 formed in the silicon substrate 119. Transfer of charges generated by photoelectric conversion is performed via the first compound semiconductor layer 140, and inhibition of movement of charges at the time of transfer can be reduced. High-speed imaging of the semiconductor device 1 formed as an imaging element is possible.

5. Fifth Embodiment

In the pixel 200 according to the above-described fourth embodiment, the p-type well region is disposed in the region of the silicon substrate 119 at a boundary between the pixels 200. Meanwhile, a pixel 200 according to a fifth embodiment of the present disclosure is different from that of the above-described fourth embodiment in including a separation layer.

[Configuration of Imaging Element]

Figure 10:
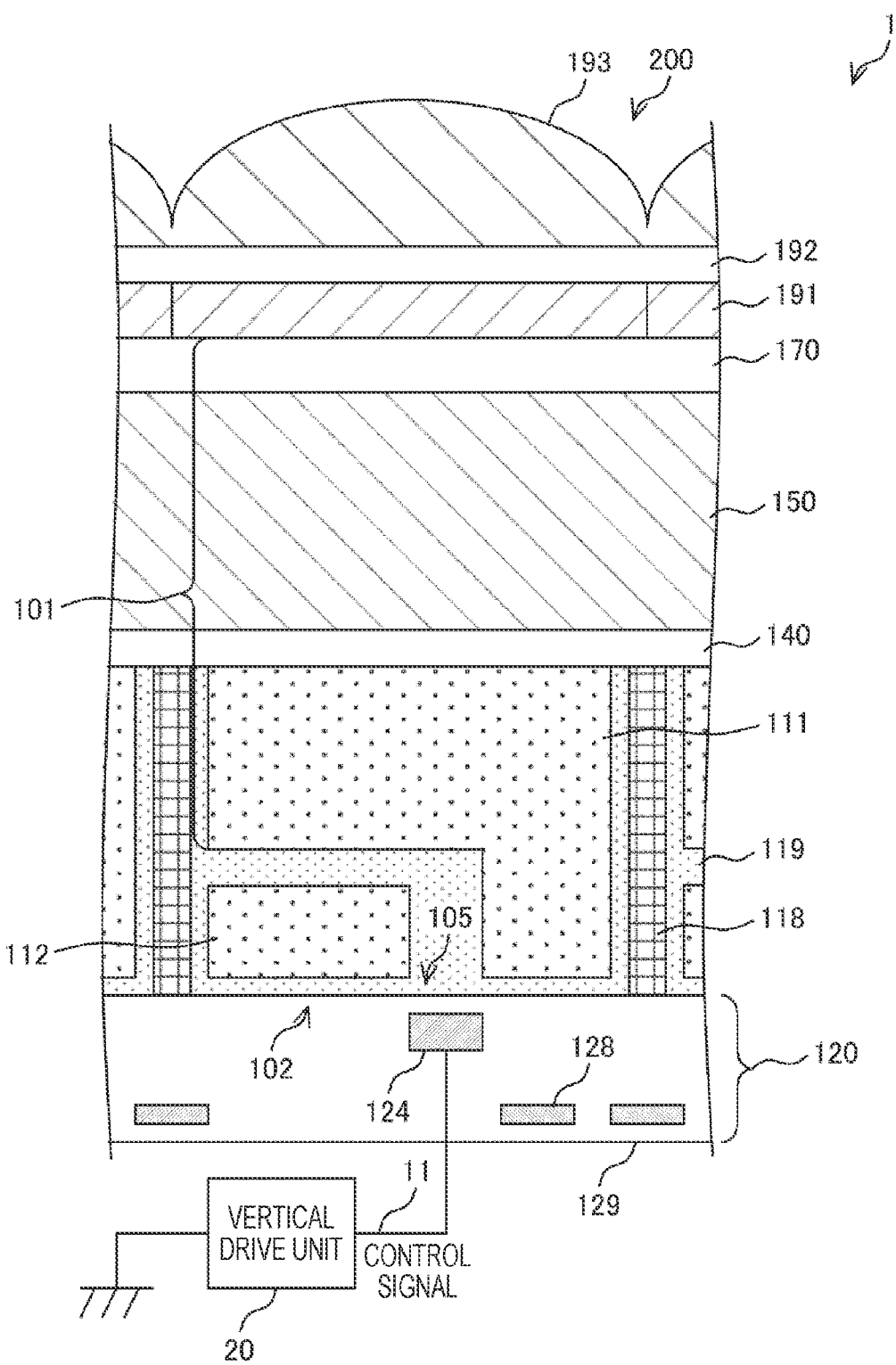
FIG. 10 is a diagram illustrating a configuration example of a pixel according to a fifth embodiment of the present disclosure.

FIG. 10 is a diagram illustrating a configuration example of a pixel according to the fifth embodiment of the present disclosure. The pixel 200 in FIG. 10 is different from the pixel 200 in FIG. 7 in that a separation layer 118 is disposed in a silicon substrate 119.

The separation layer 118 is disposed in the silicon substrate 119 at a boundary between the pixels 200, and surrounds and separates a portion of the silicon substrate 119 of the pixel 200. The separation layer 118 is constituted by, for example, an insulating substance such as $SiO_2$ and separates the adjacent pixels 200 from each other. By disposing the separation layer 118, movement of charges between the adjacent pixels 200 can be prevented, and occurrence of crosstalk can be reduced. The separation layer 118 can be formed by embedding $SiO_2$ or the like in a groove (trench) formed in the silicon substrate 119. Note that the separation layer 118 in FIG. 10 illustrates an example formed in a shape penetrating the silicon substrate 119.

Note that the configuration of the pixel 200 is not limited to this example. For example, the pixel 200 can adopt a configuration including the separation layer 118 having a shape not penetrating the silicon substrate 119.

Since the configuration of the semiconductor element 100 other than this is similar to the configuration of the semiconductor element 100 described in the fourth embodiment of the present disclosure, description thereof will be omitted.

As described above, in the semiconductor device 1 according to the fifth embodiment of the present disclosure, by disposing the separation layer 118 in the silicon substrate 119 of the pixel 200, an influence of crosstalk from the adjacent pixel 200 can be reduced.

6. Sixth Embodiment

The pixel 200 according to the above-described fourth embodiment uses the MOS transistor 105 in which the gate electrode 124 is disposed on a surface of the silicon substrate 119. Meanwhile, a pixel 200 according to a sixth embodiment of the present disclosure is different from that of the above-described fourth embodiment in including a MOS transistor 105 formed as a vertical transistor.

[Configuration of Imaging Element]

Figure 11:
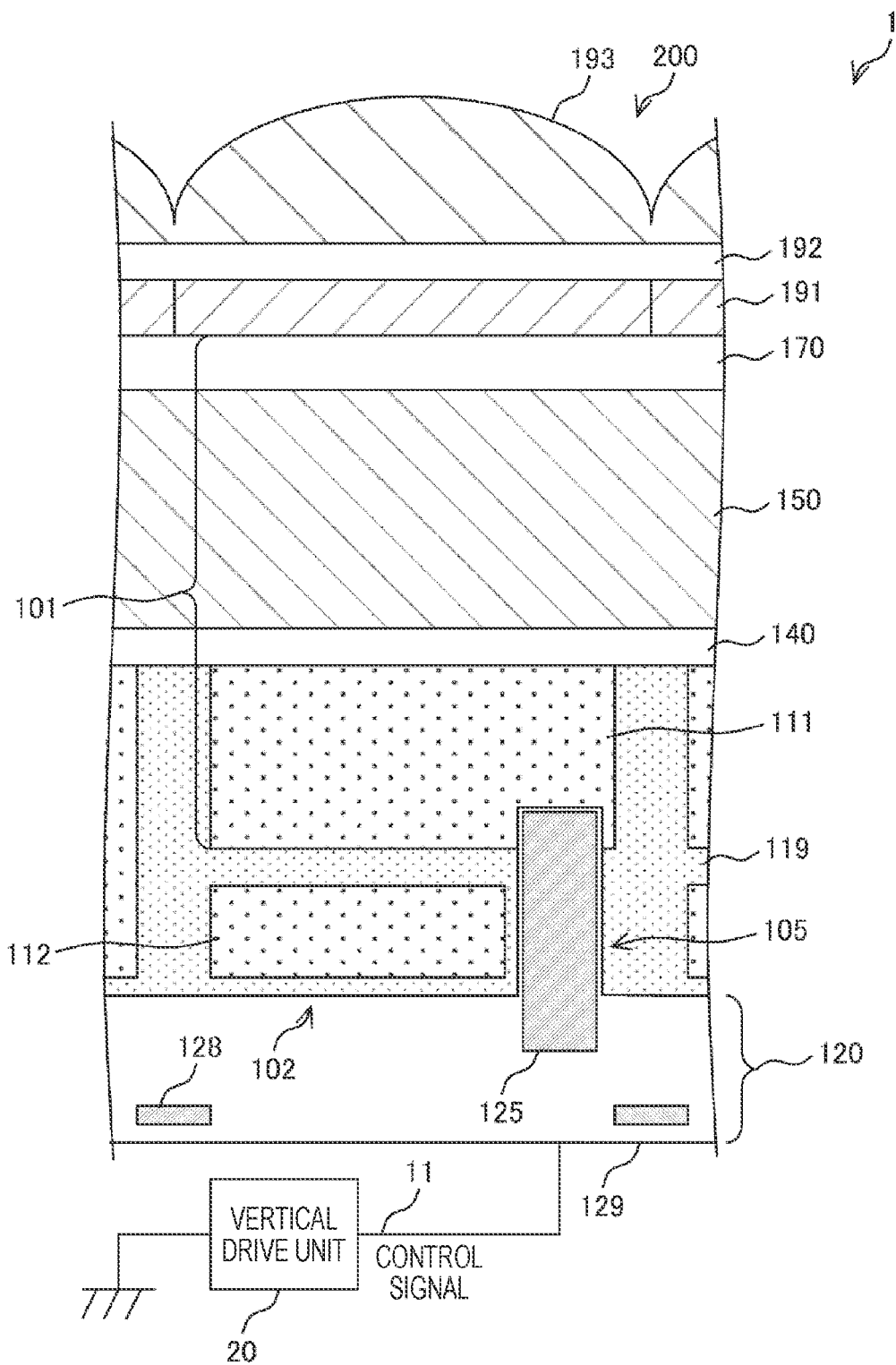
FIG. 11 is a diagram illustrating a configuration example of a pixel according to a sixth embodiment of the present disclosure.

FIG. 11 is a diagram illustrating a configuration example of a pixel according to the sixth embodiment of the present disclosure. The pixel 200 in FIG. 11 is different from the pixel 200 in FIG. 7 in that the MOS transistor 105 formed as a vertical transistor is disposed and a gate electrode 125 is disposed instead of the gate electrode 124.

The vertical transistor in FIG. 11 is a MOS transistor that transfers charges in a thickness direction of a silicon substrate 119. The gate electrode 125 is formed so as to be embedded in a region from a surface of the silicon substrate 119 to an n-type semiconductor region 111. Furthermore, the gate electrode 125 is disposed adjacent to an n-type semiconductor region 112. Note that a gate insulating film is disposed between the gate electrode 125 and the silicon substrate 119. When a control signal is applied to the gate electrode 125, a channel is formed in a p-type well region adjacent to the gate electrode 125 between n-type semiconductor regions 111 and 112, and charges are transferred. By disposing the MOS transistor 105 formed as a vertical transistor, charges can be easily transferred from the n-type semiconductor region 111 disposed on a back surface side of the silicon substrate 119. As compared with FIG. 7, the shape of the n-type semiconductor region 111 can be simplified.

Since the configuration of the semiconductor element 100 other than this is similar to the configuration of the semiconductor element 100 described in the fourth embodiment of the present disclosure, description thereof will be omitted.

As described above, in the semiconductor device 1 according to the sixth embodiment of the present disclosure, by disposing the MOS transistor 105 formed as a vertical transistor in the pixel 200, the shape of the n-type semiconductor region 111 can be simplified.

7. Seventh Embodiment

In the pixel 200 according to the above-described fourth embodiment, the second electrode 170 is disposed. Meanwhile, a pixel 200 according to a seventh embodiment of the present disclosure is different from that of the above-described fourth embodiment in using a charge accumulation region of a second compound semiconductor layer 150 formed by disposing a fixed charge film as a second electrode.

[Configuration of Imaging Element]

Figure 12:
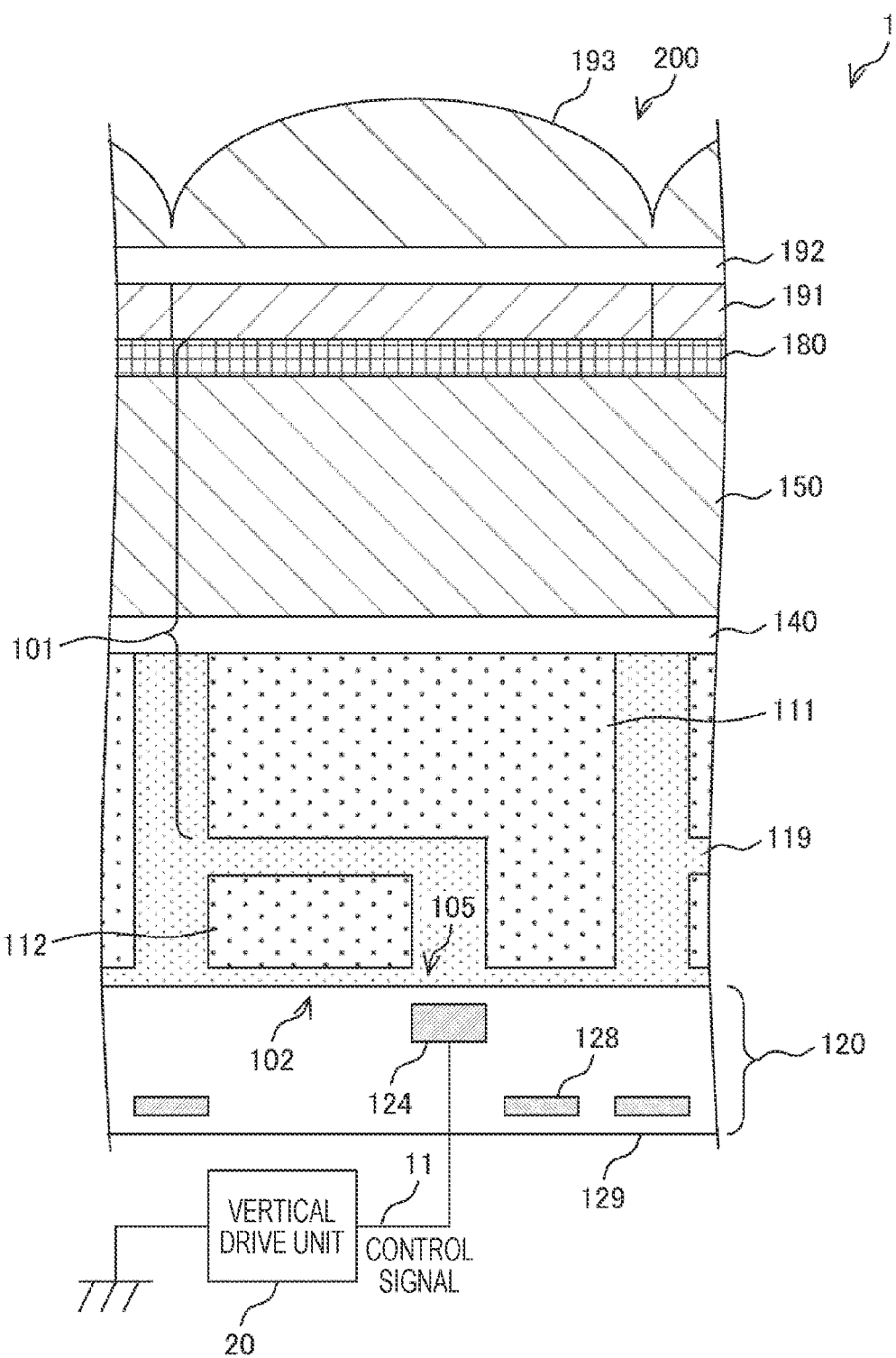
FIG. 12 is a diagram illustrating a configuration example of a pixel according to a seventh embodiment of the present disclosure.

FIG. 12 is a diagram illustrating a configuration example of a pixel according to the seventh embodiment of the present disclosure. The pixel 200 in FIG. 12 is different from the pixel 200 in FIG. 7 in that a fixed charge film 180 is disposed instead of the second electrode 170.

The fixed charge film 180 is constituted by a dielectric having fixed charges. The fixed charge film 180 is disposed adjacent to a second compound semiconductor layer 150, and forms a charge accumulation layer in the second compound semiconductor layer 150 by its own fixed charges. This charge accumulation layer can be used as a second electrode. Furthermore, since the charge accumulation layer is formed, a surface level of the second compound semiconductor layer 150 is pinned, and dark current can also be reduced. The fixed charge film 180 can be constituted by, for example, aluminum oxide ($Al_2O_3$).

Since the configuration of the semiconductor element 100 other than this is similar to the configuration of the semiconductor element 100 described in the fourth embodiment of the present disclosure, description thereof will be omitted.

As described above, in the semiconductor device 1 according to the seventh embodiment of the present disclosure, the fixed charge film 180 is disposed in the pixel 200, and the charge accumulation layer formed in the second compound semiconductor layer 150 is used as a second electrode. Therefore, pinning of an interface level of the second compound semiconductor layer 150 is performed, and the second electrode 170 can be omitted.

8. Eighth Embodiment

In the pixel 200 according to the above-described seventh embodiment, the fixed charge film 180 is disposed. Meanwhile, a pixel 200 according to an eighth embodiment of the present disclosure is different from that of the above-described seventh embodiment in that a fixed charge film 180 is also used for separating a second compound semiconductor layer 150.

[Configuration of Imaging Element]

Figure 13:
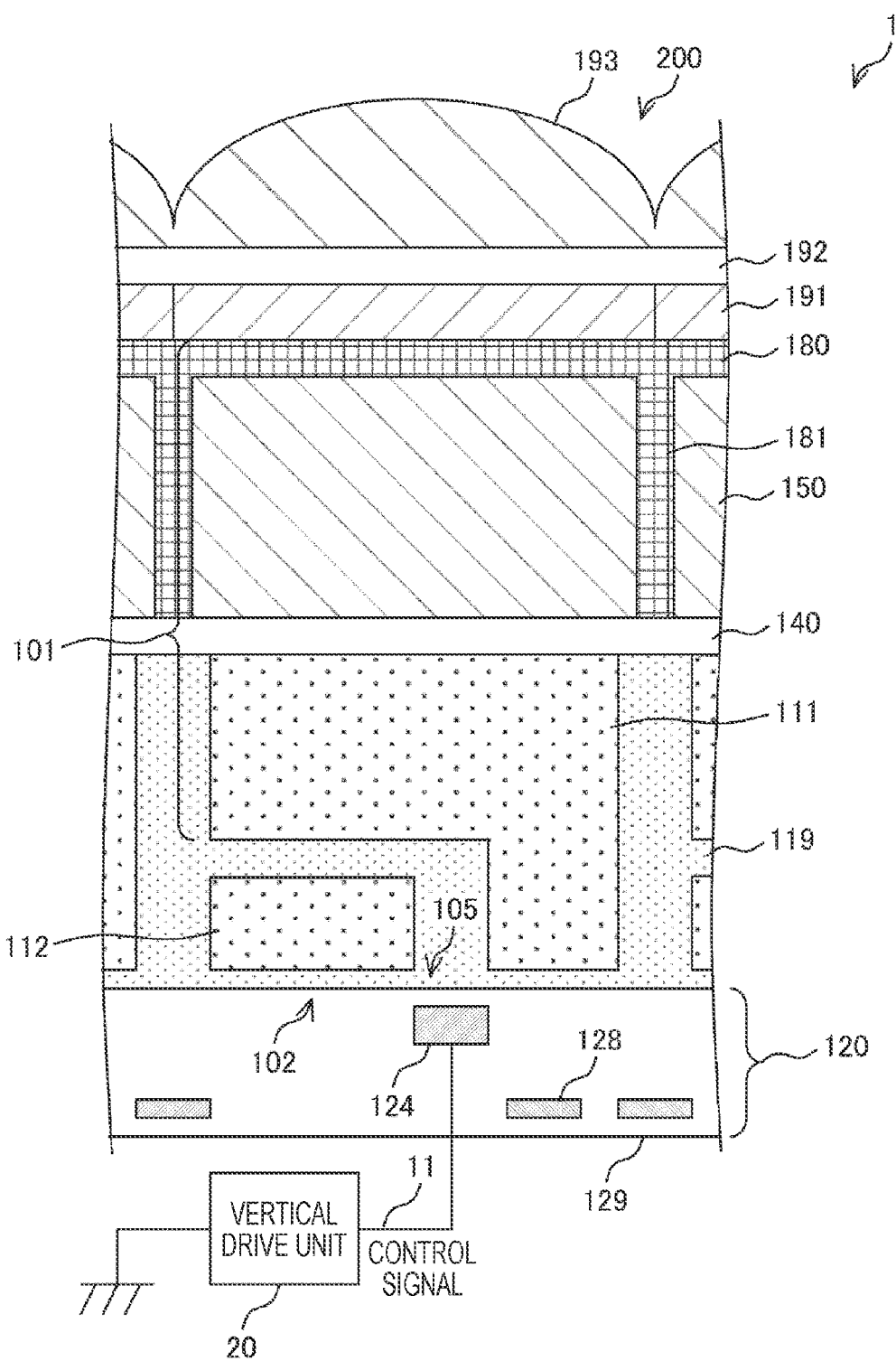
FIG. 13 is a diagram illustrating a configuration example of a pixel according to an eighth embodiment of the present disclosure.

FIG. 13 is a diagram illustrating a configuration example of a pixel according to the eighth embodiment of the present disclosure. The pixel 200 in FIG. 13 is different from the pixel 200 in FIG. 12 in that a separation unit 181 is disposed in the second compound semiconductor layer 150.

The separation unit 181 surrounds and separates the second compound semiconductor layer 150. The separation unit 181 is disposed in the second compound semiconductor layer 150 at a boundary between the pixels 200 to separate the adjacent pixels 200 from each other. The separation unit 181 in FIG. 13 represents an example of a separation unit constituted by a fixed charge film. The separation unit 181 can be formed by forming a trench in the second compound semiconductor layer 150 and embedding the fixed charge film 180 in the trench. By disposing the separation unit 181, movement of charges from the second compound semiconductor layer 150 of the adjacent pixel 200 can be prevented, and crosstalk can be reduced.

Since the configuration of the semiconductor element 100 other than this is similar to the configuration of the semiconductor element 100 described in the seventh embodiment of the present disclosure, description thereof will be omitted.

As described above, in the semiconductor device 1 according to the eighth embodiment of the present disclosure, by disposing the separation unit 181 in the second compound semiconductor layer 150, crosstalk from the adjacent pixel 200 can be reduced.

9. Ninth Embodiment

The pixel 200 according to the above-described eighth embodiment uses the separation unit 181 constituted by a fixed charge film. Meanwhile, a pixel 200 according to a ninth embodiment of the present disclosure is different from that of the above-described eighth embodiment in using a separation unit constituted by a third compound semiconductor layer 160.

[Configuration of Imaging Element]

Figure 14:
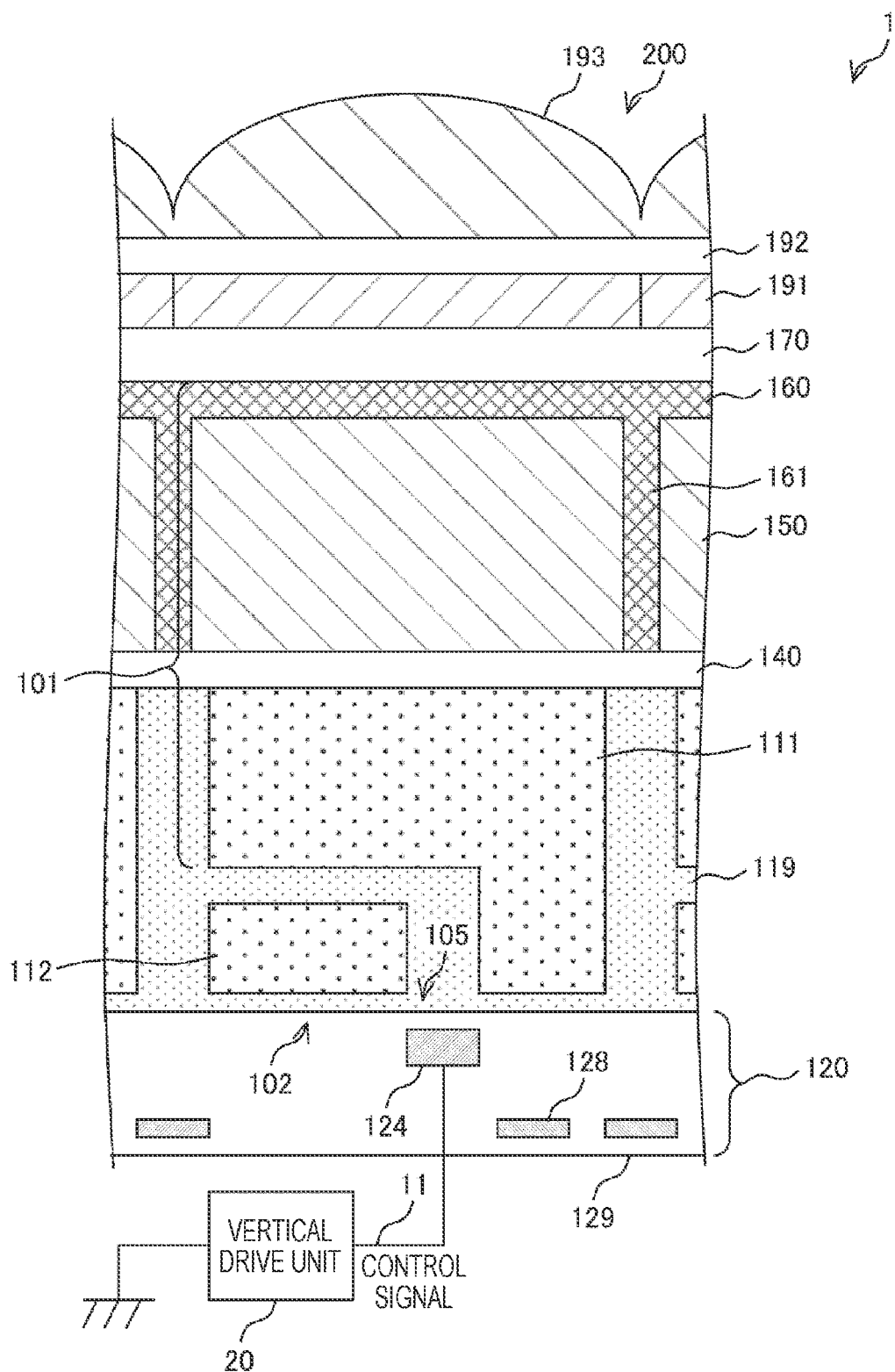
FIG. 14 is a diagram illustrating a configuration example of a pixel according to a ninth embodiment of the present disclosure.

FIG. 14 is a diagram illustrating a configuration example of a pixel according to the ninth embodiment of the present disclosure. The pixel 200 in FIG. 14 is different from the pixel 200 in FIG. 13 in that the third compound semiconductor layer 160 and a separation unit 161 are disposed instead of the fixed charge film 180 and the separation unit 181, and a second electrode 170 is disposed.

As described above in FIG. 3, the third compound semiconductor layer 160 is a p-type compound semiconductor layer disposed between a second compound semiconductor layer 150 and the second electrode 170. The separation unit 161 in FIG. 14 is a separation unit constituted by the third compound semiconductor layer 160. By disposing a compound semiconductor layer having a conductivity type different from the second compound semiconductor layer 150, the second compound semiconductor layer 150 can be separated. The separation unit 161 can be formed by forming a trench reaching a first compound semiconductor layer 140 in the second compound semiconductor layer 150 and epitaxially growing the third compound semiconductor layer 160. By disposing the separation unit 161, movement of charges from the second compound semiconductor layer 150 of the adjacent pixel 200 can be prevented, and crosstalk can be reduced.

Since the configuration of the semiconductor element 100 other than this is similar to the configuration of the semiconductor element 100 described in the eighth embodiment of the present disclosure, description thereof will be omitted.

As described above, in the semiconductor device 1 according to the eighth embodiment of the present disclosure, by disposing the separation unit 161 in the second compound semiconductor layer 150, crosstalk from the adjacent pixel 200 can be reduced.

Note that the configuration of the semiconductor element 100 according to the second embodiment can be applied to other embodiments. Specifically, the third compound semiconductor layer 160 described in FIG. 3 may be combined with each of the semiconductor elements 100 in FIGS. 7 and 10 to 13.

The configuration of the semiconductor element 100 according to the third embodiment can be applied to other embodiments. Specifically, the through electrode 122 described in FIG. 4 may be combined with each of the semiconductor elements 100 in FIGS. 7 and 10 to 14.

The configuration of the semiconductor element 100 according to the fifth embodiment can be applied to other embodiments. Specifically, the separation layer 118 described in FIG. 10 may be combined with each of the semiconductor elements 100 in FIGS. 11 to 14.

The configuration of the semiconductor element 100 according to the sixth embodiment can be applied to other embodiments. Specifically, the MOS transistor 105 described in FIG. 11 may be combined with each of the semiconductor elements 100 in FIGS. 12 and 14.

The configuration of the semiconductor element 100 according to the seventh embodiment can be applied to other embodiments. Specifically, the fixed charge film 180 described in FIG. 12 may be combined with the semiconductor element 100 in FIG. 14.

Finally, the description of each of the above-described embodiments is an example of the present disclosure, and the present disclosure is not limited to the above-described embodiments. For this reason, it is needless to say that various modifications can be made according to design and the like without departing from the technical idea according to the present disclosure even if the modifications are outside the above-described embodiments.

Furthermore, the effects described in the present specification are merely examples and are not limited. Furthermore, there may be other effects.

Furthermore, the drawings in the above-described embodiments are schematic, and a dimensional ratio or the like of each portion does not necessarily coincide with an actual one. Furthermore, it is needless to say that the drawings include portions having different dimensional relationships and ratios from each other.

Note that the present technology can adopt the following configurations.

(1) A semiconductor element including:
a silicon substrate;
a first compound semiconductor layer formed on the silicon substrate;
a second compound semiconductor layer stacked on the first compound semiconductor layer; and
an electrode that is disposed on the silicon substrate and controls movement of charges between the silicon substrate and the second compound semiconductor layer via the first compound semiconductor layer.

(2) The semiconductor element according to (1), in which the first compound semiconductor layer contains Ga and P.

(3) The semiconductor element according to (1) or (2), in which the second compound semiconductor layer contains Ga, As, P, and N.

(4) The semiconductor element according to any one of (1) to (3), in which the first compound semiconductor layer has a film thickness of 50 nm or less.

(5) The semiconductor element according to any one of (1) to (4), in which the second compound semiconductor layer has a film thickness of 3 μm or more.

(6) The semiconductor element according to any one of (1) to (5), in which
the electrode is disposed on a front surface of the silicon substrate, and
the first compound semiconductor layer is formed on a back surface of the silicon substrate that is a surface different from the front surface.

(7) The semiconductor element according to any one of (1) to (6), further including a second electrode which is disposed adjacent to the second compound semiconductor layer and in which a voltage for controlling movement of the charges is applied between the electrode and the second electrode.

(8) The semiconductor element according to (7), in which the second electrode is constituted by a transparent electrode.

(9) The semiconductor element according to (7), further including
a fixed charge film disposed adjacent to the second compound semiconductor layer and constituted by a dielectric having fixed charges, in which
the second electrode is constituted by a charge accumulation region formed in the second compound semiconductor layer on the basis of the fixed charges of the fixed charge film.

(10) The semiconductor element according to any one of (1) to (9), further including a third compound semiconductor layer stacked on the second compound semiconductor layer and having a conductivity type different from the second compound semiconductor layer.

(11) The semiconductor element according to any one of (1) to (10), further including a separation unit that surrounds and separates the second compound semiconductor layer.

(12) The semiconductor element according to (11), in which the separation unit is constituted by a dielectric having fixed charges.

(13) The semiconductor element according to (11), in which the separation unit is constituted by a compound semiconductor having a conductivity type different from the second compound semiconductor layer.

(14) The semiconductor element according to any one of (1) to (13), in which the electrode controls movement of the charges generated in the second compound semiconductor layer by photoelectric conversion.

(15) The semiconductor element according to (14), in which the electrode performs the control by application of a control signal for moving the charges to the silicon substrate.

(16) The semiconductor element according to (15), further including a charge holding unit that is disposed in the silicon substrate and holds the moved charges.

(17) The semiconductor element according to (16), further including an image signal generation circuit that generates an image signal on the basis of the held charges.

(18) The semiconductor element according to (14), further including a separation layer that surrounds and separates the silicon substrate.

(19) The semiconductor element according to any one of (1) to (10), in which the electrode controls movement of charges to be recombined for light emission in the second compound semiconductor layer.

(20) A semiconductor device including:
a silicon substrate;
a first compound semiconductor layer formed on the silicon substrate;
a second compound semiconductor layer stacked on the first compound semiconductor layer;
an electrode that is disposed on the silicon substrate and controls movement of charges between the silicon substrate and the second compound semiconductor layer via the first compound semiconductor layer; and
a control circuit that supplies a control signal for the control to the electrode.

REFERENCE SIGNS LIST

1 Semiconductor device
2 Control circuit
10 Pixel array unit
20 Vertical drive unit
30 Column signal processing unit
100 Semiconductor element
101 Photoelectric conversion unit
102 Second charge holding unit
103 First charge holding unit
104 to 109 MOS transistor 110, 119 Silicon substrate
111, 112 n-Type semiconductor region
118 Separation layer
120 Wiring region
121, 123 Electrode
122 Through electrode
124, 125 Gate electrode
140 First compound semiconductor layer
150 Second compound semiconductor layer
160 Third compound semiconductor layer
161, 181 Separation unit
170 Second electrode
180 Fixed charge film
200 Pixel

The invention claimed is:

1. A semiconductor element, comprising:
   a silicon substrate;
   a first compound semiconductor layer on a back surface of the silicon substrate;
   a second compound semiconductor layer on the first compound semiconductor layer; and
   a first electrode on a front surface of the silicon substrate, wherein
   the back surface of the silicon substrate is different from the front surface of the silicon substrate, and
   the first electrode is configured to control a movement of charges between the silicon substrate and the second compound semiconductor layer via the first compound semiconductor layer.

2. The semiconductor element according to claim 1, wherein the first compound semiconductor layer includes Gallium (Ga) and Phosphorus (P).

3. The semiconductor element according to claim 1, wherein the second compound semiconductor layer includes Gallium (Ga), Arsenic (As), Phosphorus (P), and Nitrogen (N).

4. The semiconductor element according to claim 1, wherein the first compound semiconductor layer has a film thickness of 50 nm or less.

5. The semiconductor element according to claim 1, wherein the second compound semiconductor layer has a film thickness of 3 μm or more.

6. The semiconductor element according to claim 1, further comprising a second electrode adjacent to the second compound semiconductor layer, wherein a voltage for the control of the controlling movement of the charges is applied between the first electrode and the second electrode.

7. The semiconductor element according to claim 6, wherein the second electrode is constituted by a transparent electrode.

8. The semiconductor element according to claim 6, further comprising
   a fixed charge film adjacent to the second compound semiconductor layer, wherein
   the fixed charge film includes a dielectric having fixed charges,
   the second compound semiconductor layer includes a charge accumulation region as the second electrode, and
   formation of the charge accumulation region in the second compound semiconductor layer is based on the fixed charges of the fixed charge film.

9. The semiconductor element according to claim 1, further comprising a third compound semiconductor layer on the second compound semiconductor layer, wherein the third compound semiconductor layer has a conductivity type different from that of the second compound semiconductor layer.

10. The semiconductor element according to claim 1, further comprising a separation unit that surrounds and separates the second compound semiconductor layer.

11. The semiconductor element according to claim 10, wherein the separation unit includes a dielectric having fixed charges.

12. The semiconductor element according to claim 10, wherein the separation unit includes a compound semiconductor that has a conductivity type different from that of the second compound semiconductor layer.

13. The semiconductor element according to claim 1, wherein the first electrode is further configured to control the movement of the charges in the second compound semiconductor layer, and
   generation of the charges in the second compound semiconductor layer is by photoelectric conversion.

14. The semiconductor element according to claim 13, wherein the first electrode is further configured to apply a control signal for the movement of the charges to the silicon substrate.

15. The semiconductor element according to claim 13, further comprising a charge holding unit in the silicon substrate, wherein the charge holding unit is configured to hold the moved charges.

16. The semiconductor element according to claim 15, further comprising an image signal generation circuit configured to generate an image signal based on the held charges.

17. The semiconductor element according to claim 13, further comprising a separation layer that surrounds and separates the silicon substrate.

18. The semiconductor element according to claim 1, wherein the first electrode is further configured to control movement of charges to be recombined for light emission in the second compound semiconductor layer.

19. A semiconductor device, comprising:
   a silicon substrate;
   a first compound semiconductor layer on a back surface of the silicon substrate;
   a second compound semiconductor layer on the first compound semiconductor layer;
   an electrode on a front surface of the silicon substrate, wherein
   the back surface of the silicon substrate is different from the front surface of the silicon substrate, and
   the electrode is configured to control a movement of charges between the silicon substrate and the second compound semiconductor layer via the first compound semiconductor layer; and
   a control circuit configured to supply, to the electrode, a control signal for the control of the movement of the charges.

* * * * *